(12) United States Patent
Bonen et al.

(10) Patent No.: US 9,640,277 B2
(45) Date of Patent: May 2, 2017

(54) AVOIDING DQS FALSE SAMPLING TRIGGERS

(71) Applicant: Intel Corporation, Santa Clara, CA (US)

(72) Inventors: Nadav Bonen, Ofer (IL); Alexey Kostinsky, Nahariya (IL)

(73) Assignee: Intel Corporation, Santa Clara, CA (US)

( * ) Notice: Subject to any disclaimer, the term of this patent is extended or adjusted under 35 U.S.C. 154(b) by 628 days.

(21) Appl. No.: 14/142,812

(22) Filed: Dec. 28, 2013

(65) Prior Publication Data

US 2015/0186328 A1 Jul. 2, 2015

(51) Int. Cl.
| | | |
|---|---|---|
| *G06F 13/42* | (2006.01) | |
| *G11C 5/00* | (2006.01) | |
| *G11C 29/02* | (2006.01) | |
| *G11C 7/02* | (2006.01) | |
| *G11C 7/22* | (2006.01) | |

(52) U.S. Cl.
CPC .......... *G11C 29/022* (2013.01); *G11C 29/023* (2013.01); *G11C 29/028* (2013.01); *G11C 7/02* (2013.01); *G11C 7/222* (2013.01); *G11C 2207/2254* (2013.01)

(58) Field of Classification Search
CPC .................................... G11C 7/10; G11C 7/22

USPC ......................................................... 710/105
See application file for complete search history.

(56) References Cited

U.S. PATENT DOCUMENTS

| | | | | |
|---|---|---|---|---|
| 7,480,197 B2* | 1/2009 | Carnevale | ............ | G11C 7/1051 365/193 |
| 2004/0071015 A1* | 4/2004 | Borkenhagen | ....... | G11C 7/1078 365/189.05 |
| 2008/0239841 A1* | 10/2008 | Carnevale | ............ | G11C 7/1051 365/193 |
| 2013/0010546 A1* | 1/2013 | Wang | ...................... | G11C 7/02 365/189.07 |
| 2014/0307514 A1* | 10/2014 | Prakash | ................. | G11C 7/222 365/193 |

* cited by examiner

*Primary Examiner* — Titus Wong
(74) *Attorney, Agent, or Firm* — Compass IP Law PC

(57) ABSTRACT

A system avoids false sampling due to reflections from previous commands or other noise on a data strobe line. The system uses a normalizer circuit or leaker circuit, and the data strobe line is not optimally terminated or is unterminated. The data strobe line is to receive a burst of data sample pulses or edges and sample a data line based on the edges. The receiving device includes logic that generates a count triggered from an initial edge on the data strobe line, and identifies, based on the count, an initial valid edge of the burst. Any false strobes due to noise or reflections that are received prior to the actual burst can be rejected.

23 Claims, 11 Drawing Sheets

AVOIDING DQS FALSE SAMPLING TRIGGERS

FIELD

Embodiments of the invention are generally related to inter-device communication, and more particularly to detecting and/or avoiding false sampling triggers on a Data Strobe signal line.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2013, Intel Corporation, All Rights Reserved.

BACKGROUND

Power performance of electronic devices has received increased attention, especially as devices become smaller and portable. As great power performance increases have been made with data processing within individual device chips, communication between device chips has consumed an increased percentage of total power consumption of portable electronic devices. However, communication between device chips is necessary for the portable electronic devices to perform their intended functions, especially communication between processing resources and memory resources.

LPDDR (low power dual data rate) memory devices, and specifically LPDDR2 (low power dual data rate version 2, JESD209-2F, June 2013), LPDDR3 (LPDDR version 3, JESD209-3B, August 2013), LPDDR4 (LPDDR version 4, specification in development by JEDEC (Joint Electronic Device Engineering Council) as of the filing of this application) and future LPDDR generations, allow the use of lightly terminated or unterminated I/O (input/output) interfaces. The termination of the I/O interfaces consumes non-useful energy by converting power to heat to terminate the I/O interfaces. By allowing lighter termination or no termination on I/O interfaces, certain power savings can be achieved, albeit at the cost of reflections and/or other noise on the I/O interfaces. Reflections are echoes from previous transactions, which may travel back and forth over a signal line for some time. The size and timing of the reflections or other noise can cause the receiving device (e.g., a memory controller circuit receiving data from a memory device) to incorrectly sample the echo causing errors in the system.

Reflections are currently handled by the use of stronger termination, which suppresses static noise on the I/O interface, at the cost of wasting active power. Alternatively, access transactions can be separated in time far enough to allow the reflections to die out, which can significantly reduce memory bandwidth and performance. It will also be understood that reflections are typically not as significant in stacked (e.g., package on package (PoP)) device configurations; however, such stacked configurations only work for certain system implementations, and therefore, using stacked configurations is very limited in its ability to avoid false sampling due to noise and reflections.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
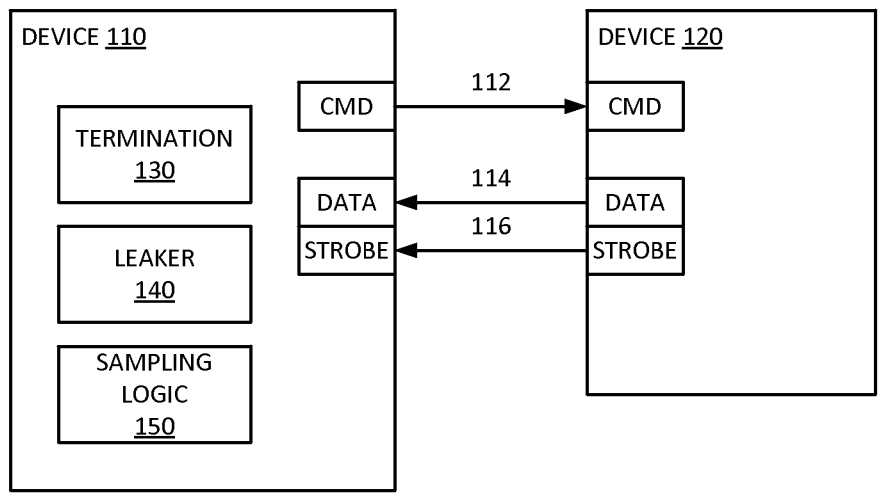
FIG. 1 is a block diagram of an embodiment of a system having a mechanism to avoid false sampling due to noise on a lightly terminated data strobe line.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a system avoids false sampling caused by reflections from previous commands or other noise on a data strobe line. The system uses a normalizer circuit or leaker circuit, and the data strobe line is unterminated or not optimally terminated. A data strobe line is unterminated if termination circuitry is not applied to suppress reflections on the line. A data strobe line is not optimally terminated if the termination allows reflections (e.g., not an ideal impedance match). It will be understood that a transmission line or I/O (input/output) line can be terminated at both sides of the I/O interface, and are typically terminated at the receiving end of a line. The terminations described herein typically refer to a device that receives a data signal and associated data strobe signal. In one embodiment, the receiving device is a memory controller circuit that receives a data signal from a memory device in response to a memory access command generated by the memory controller.

The data strobe line is to receive a burst of data sample pulses or edges and sample a number of data lines based on the strobe edges. The receiving device includes logic that generates a count triggered from an initial edge on the data strobe line, and identifies an initial valid edge of the burst based on the count. An edge can refer to either a falling and/or rising edge, which are both used for example in dual data rate (DDR) systems. A pulse (which can also be referred to as a strobe) refers to a rising edge followed by a falling edge, or a falling edge followed by a rising edge. The polarity of the pulse matches the strobe or sample line on which the pulse is received. For example, a "p-type" strobe line typically starts low, and a pulse would thus include a rising edge followed a timing period later by a falling edge. The polarity could be reversed for an "n-type" strobe line. Discussion of edges can be modified appropriately to refer to pulses or strobes. Any false pulses due to noise or reflections that are received prior to the actual burst can be rejected.

Thus, a system can employ lightly terminated and/or unterminated I/O between two devices or device chips. For example, a system on a chip (SOC) or other system having a memory controller circuit and a memory device can have more power efficient communication with less negative impact on bandwidth and performance. LPDDR (low power DDR) memory is commonly used in mobile devices or other low power device (e.g., mobile phones, smart phones, tablets, ultrabooks, laptops, convertible laptops, low power servers) where power conservation is important. If the system uses an internal clock generator associated with the timing of opening a read buffer (or triggering a receive enable), there is synchronous operation and the system can avoid noise simply by sampling the signals based on a known phase delay from a synchronous clock. However, LPDDR2, LPDDR3, and LPDDR4 memory devices do not include internal clock sources (by design). Thus, a Read operation is not a fully synchronous operation, allowing a significant amount of drift relative to the expected timing. The drift, in turn, creates a significant risk of timing violation in the receiver. At the time of filing, the current approach is to use a leaker circuit and open the receive buffer earlier than any possible drift can occur. The leaker circuit overcomes any static noise on the data strobe line/bus, and effectively prolongs its preamble until the actual transmission begins. However, strong noise and/or reflections on the data strobe line/bus can overcome the leaker circuit voltage levels and cause false sampling. A system can employ one or more of: pulse timing detection, pulse burst length detection, inversed leaker circuitry, strobe line training, and/or dynamic timing tracking to avoid false sampling.

In one embodiment, with pulse timing detection, the system includes logic to detect timing of the pulses and/or edges of the pulses to determine if the measured timing matches an expected timing. In one embodiment, a valid I/O transaction (i.e., a read command followed by a data reply to the command) has an associated preamble with the reply transaction. The preamble is transmitted by the sending device, and guarantees that no reflections or noise will be present on the line. The LPDDR3 specification specifies at least 0.9*DCLK (data clock) during which the transmitting device (e.g., the DRAM (dynamic random access memory) or memory device) will apply a full buffer and suppress noise on the line. In one embodiment, the I/O specification also specifies pulse width. For example, LPDDR3 specifies a valid DQS pulse width is 0.5 DCLK for High and 0.5 DCLK for Low. Other timing parameters will be understood for other I/O specifications. While specific reference is made to LPDDR3, it will be understood that the mechanisms for avoiding false sampling can be applied to LPDDR2, LPDDR3, LPDDR4, and/or future specifications and/or derivatives or extensions of one of these standards subject to similar physical phenomena.

In one embodiment, the receiving device tracks a silence period (e.g., Low for p-type polarity, and High for n-type polarity) on the strobe line (e.g., DQS). Thus, the receiving device can generate a count to track the timing of the received burst to determine if the measured timing matches expected timing. If the silence period is longer than a valid transition between pulses (which could also include a specified margin for jitter and/or other phenomena, in accordance with the I/O specification), the system can determine that the valid period cannot be a transition between two pulses, and must therefore be the preamble. The preamble by definition precedes the initial valid pulse or initial valid edge, and subsequent pulses/edges. For the sake of simplicity, reference is typically made to valid pulses. As stated above, it will be understood that specific edges can be monitored instead of pulses, and the descriptions below will be understood to apply (possibly with some modification that will be apparent to one skilled in the art, unless otherwise stated) to edges as well as pulses. Any samples registered before the preamble can be determined to be the result of noise, and thus false or erroneous data sampling. Such samples can be ignored and/or removed from a buffer (e.g., a FIFO (first in, first out) buffer).

In one embodiment, with pulse burst length detection the system can count a number of pulses or edges. The I/O specification can define a burst as including a number of pulses and/or edges. For example, LPDDR3 specifies four pulses (eight edges). Thus, the system can generate a count to determine if the number of pulses received is an expected number, and ignore and/or eliminate extra pulses. If extra pulses are detected, it is expected that the initial pulse was improper, and received prior to the preamble. Thus, the last-received correct number of pulses can be used as valid pulses. The system can identify an initial valid pulse as being one counted back from a last-received pulse.

In one embodiment, a system that implements pulse counting can provide a spacer (e.g., a one or multiple cycle delay) after every transaction, or only after a transaction anticipated to result in a reflection. It will be understood that not all transactions will necessarily result in echoes on the strobe line. Thus, in one embodiment, the system characterizes the echo or noise behavior of the strobe line. Characterizing the behavior of the system is described in more detail below with respect to strobe line training. For example, when the receiving device knows that transaction N will likely generate a reflection or echo (a reflection of electromagnetic signal energy on a transmission line due to impedance mismatch), the system can include a spacer between transactions N+1 and N+2. The system can then guarantee that transaction N+2 will not come back-to-back to transaction N+1, which will give a more certain cutoff to the N+1 burst. The certain cutoff on the N+1 burst enables the system to count the pulses and determine if a false pulse also triggered on the line. When receiving transaction N+1, the detection mechanism (e.g., logic) of the receiving system should find the spacer (e.g., a 1-clock long bubble in the end of transaction N+1). In one embodiment, the detection logic keeps only the last sampled bits of data from the data line, and can ignore earlier bits that would be due to a false sampling strobe.

In one embodiment, a system includes inversed leaker circuitry. A DQS leaker circuit can also be referred to as a normalizer circuit. The leaker circuit normalizes the DQS line to a voltage rail (either the high or low rail, depending on the polarity of the strobe line). It will be understood that with additional logic and/or circuitry, the leaker circuit could normalize the strobe line to a voltage reference other than the voltage rail. Noise that will appear on a line will be of an opposite polarity as the preamble that the transmitting device will drive. Thus, the leaker circuit can weakly pull the line toward the voltage rail (or to a voltage reference) of opposite polarity from the preamble. The leaker circuit is thus referred to as an "inverse" leaker circuit because it pulls the line the opposite direction as the preamble. Any noise or reflection present on the line during the time the leaker circuit is active will not appear as a separate pulse on the strobe line. When the transmitting device drives the preamble, the strobe line will be pulled back to the other voltage rail, and the next strobe is guaranteed to be the initial valid pulse.

In effect, the inverse leaker circuitry acts as directed weak termination, which is only applied to the line prior to the preamble, and can be removed once the preamble is sent. Thus, the system can count a single pulse, being the inverse leaker "pulse," with the next pulse being the initial valid pulse. Thus, the receiver logic can ignore transitions on the strobe line before the preamble arrives, meaning before the strobe line goes from High to Low once, or from Low to High once, depending on the polarity of the strobe line.

In one embodiment, a system can implement strobe line training. The strobe line training allows the receiving system to train itself on the noise behavior of the strobe line, and avoid generating transactions that will be affected by the timing learned during the training. In one embodiment, the receive logic measures when echoes/reflections arrive after a command during training of the I/O interface with the sending device. The receiving device can then calculate problematic turnarounds between commands on the bus. The receiving device can then provide the timing information to logic that controls the sending of commands (e.g., a memory controller). The control logic can then avoid generating transactions separated from each other in a way that could result in echo/reflection sampling/errors, based on the training.

In one embodiment, any one or more of several different mechanisms can be used to train the I/O interface with the transmitting device, with respect to identifying the expected timing of problematic transactions. In one embodiment, receiving device can train the I/O interface by guaranteeing data signal state during read transactions to only sample reflections. In one embodiment, the receiving device can issue a strobe and measure its reflections, using existing Read Leveling circuitry.

In one embodiment, the system can implement dynamic timing tracking. A synchronous system does not require timing tracking. Thus, when the I/O interface is synchronized by an internal clock signal, and the system does not need to track the timing of the I/O interface, because both devices are matched as to the exchange of signals. Dynamic timing tracking enables the receiving system to specifically measure the timing characteristics of a burst, and use that information to track the timing of subsequent bursts within a period. The system performs a first measurement on the first data burst after a long quiet period since receiving a previous data burst. In one embodiment, the system opens RcvEn for the first burst well in advance and applies the Leaker circuit to overcome any static noise. It is assumed no reflections are present on the line at this time due to the long quiet period where no data was sent. In one embodiment, the system measures the relative delay between the time it opened RcvEn and the time the first DQS edge arrives. The system then calculates by how much the RcvEn signal can be delayed to cause it to appear during the preamble preceding the first DQS edge of a subsequent burst. Based on the tDQSCKDS LPDDR3 JEDEC parameter ("DQS output access time from CK_t/CK_c delta short"—the absolute value of the difference between any two tDQSCK measurements (in a byte lane) within a contiguous sequence of bursts in a 160 nsec rolling window), the system expects all the following data bursts within the 160 nsec rolling window to have similar relative CK timing. Thus, for subsequent bursts, the system delays the RcvEn signal according to the measurement and the calculation. The receiving device can then use the measured timing and calculated offset to more precisely enable the receive buffer during the preamble period for all the data bursts within the 160 nsec window since the previous burst, and not be enabled at a point where reflections could cause false sampling. In one embodiment, for each new data burst, the system again measures relative timing and recalculates a resulting RcvEn delay to dynamically track the timing drift. For other than LPDDR3 protocols, similar/equivalent timing parameter(s) can be used.

FIG. 1 is a block diagram of an embodiment of a system having a mechanism to avoid false sampling due to noise on a lightly terminated data strobe line. System 100 represents a system in which device 110 engages in communication or I/O with device 120. The I/O interface of system 100 includes command signal 112, data signal 114, and strobe signal 116. It will be understood that there can be multiple signal lines associated with each signal. Reference to a data line or sampling a data line can refer to one or multiple data lines. In one embodiment, a single strobe is associated with multiple data lines. Thus, a single strobe line can be used to sample on 4 or 8 (or some other number) of data lines.

Typically, device 110 drives the signal lines to send command signal 112, and device 120 drives the signal lines to send data in response to the command. Data signal 114 includes one or more data lines. Data strobe line 116 accompanies the data line(s). The data line is the line over which device 120 drives the output data. The data strobe line is the line over which device 120 identifies when device 110 should sample the data line to obtain the receive data. The data strobe line between devices 110 and 120 is lightly terminated or unterminated, and thus is subject to noise that can cause false sampling. Device 110 does not include an internal clock synchronous with device 120 for purpose of communication over the I/O interface.

In one embodiment, device 110 includes termination 130 for data signal 114 and strobe signal 116, which may be selectively applied (e.g., not applied in certain circumstances). Termination 130 can be weak or not applied. In one embodiment, device 110 does not include termination 130, at least to apply to the interface of data 114 and strobe 116. Device 110 includes leaker or normalizer circuit 140. Leaker 140 allows device 110 to drive data strobe signal line 116 to a voltage rail in preparation to receive a preamble signal prior to valid sampling pulses. In one embodiment, leaker 140 is an inverse leaker circuit, as described above, in which the leaker circuit drives the strobe line to the voltage rail opposite the one to which the strobe line is driven during the preamble. Thus, reflections or other noise will not affect the strobe line state. Device 120 will drive the strobe line back to the opposite voltage rail for the preamble, after which device 110 can determine that the subsequent sampling pulses are valid.

Device 110 includes sampling logic 150 that enables device 110 to sample the data signal in accordance with the detected sampling pulses on the strobe line. The samples can be buffered, for example in a FIFO. In one embodiment, sampling logic 150 includes logic that enables device 110 to monitor and/or store information about the received sampling pulses. Device 110 can then perform processing to determine if any of the buffered samples are erroneous due to a false sampling pulse. The processing can be any type of processing described herein, including counting a timing interval of the pulses and/or counting a number of pulses received. In one embodiment, device 110 performs training of the I/O interface to determine its characteristic reflection behavior, and can then apply that characterization to count samples, and/or to avoid sending commands that will result in data responses being received during noisy periods (e.g., providing a delay of one or more clock cycles between commands or transactions). In one embodiment, sampling logic 150 measures specific timing between the sending of a command and the receipt of a valid sampling pulse to characterize the timing of enabling the strobe line for subsequent transactions.

Devices 110 and 120 can be any devices incorporated into the same system 100. In one embodiment, devices 110 and 120 are integrated onto the same substrate. In one embodiment, device 110 includes or is a memory controller. The memory controller can itself be part of a system on a chip (SOC), a central processing unit or other processor device, or can be a standalone component. Device 120 can be a peripheral of device 110, which provides data in response to a command. A common scenario is where device 110 is a processing device or memory controller, and device 120 is a memory device, such as an LPDDR DRAM. However, the description of the mechanisms to avoid false sampling is not necessarily limited to embodiments involving a memory device and memory controller and/or processor.

Figure 2:
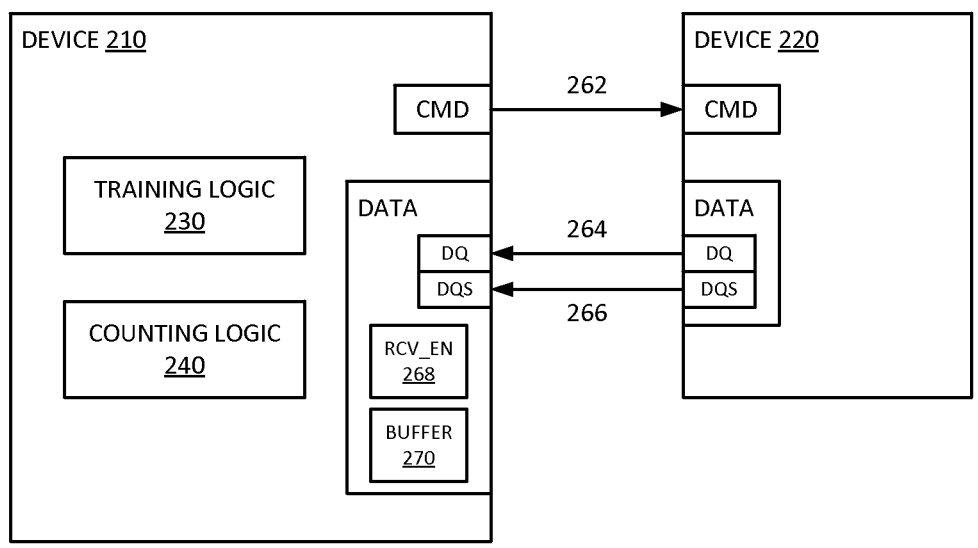
FIG. 2 is a block diagram of an embodiment of system having a lightly terminated data strobe line and a mechanism to monitor the data strobe line for valid sampling edges.

FIG. 2 is a block diagram of an embodiment of system having a lightly terminated data strobe line and a mechanism to monitor the data strobe line for valid sampling edges. System 200 can be one example of an embodiment of system 100 of FIG. 1. System 200 includes device 210, which has an I/O interface to communicate with device 220. Device 210 sends a command over command interface 262, and receives data in response to the command over data interface 264. As with the I/O interface in system 100, the I/O interface that includes command interface 262 and data interface 264 can include multiple signal lines.

While a strobe signal can be implied in system 100, system 200 shows strobe signal line 266 for purposes of clarity in description. As illustrated, the data line(s) are represented by DQ 264, and the strobe for DQ 264 is DQS 266, which device 210 uses to sample DQ 264. Buffer 270 of device 210 represents an input buffer that can hold data sampled based on pulses/edges on DQS 266. In one embodiment, buffer 270 is a FIFO buffer. Buffer 270 can be of a depth greater than an expected data burst length, which can allow device 210 to receive the data, and process the data based on strobe line information. For example, device 210 can perform any of the techniques described herein to avoid false data samples based on reflections or other noise on DQS 266.

Device 210 includes a receive enable signal (RCV_EN) 268, which represents a signal that can be used to control buffer 270. For example, a certain time after sending a command over command interface 262, device 210 can trigger receive enable 268 to allow buffer 270 to record the state of DQ 264 at the sampling times indicated by edges on DQS 266. Ideally, device 210 will trigger receive enable 268 during a preamble period on DQS 266 to avoid buffering a false sample. However, as described herein, device 210 can generate a count to use to determine whether buffered data samples are valid, based on identifying valid strobe pulses/edges. More particularly, different embodiments of device 210 can use mechanisms to identify whether a pulse was received prior to a preamble period, or use a mechanism to avoid sampling until the preamble period.

In one embodiment, device 210 includes training logic 230 to train the I/O interface between devices 210 and 220 to characterize the behavior of the I/O interface, and avoid sending combinations of commands that will cause the presence of a reflection when the device has receive enable 268 triggered. Reflections or echoes on DQS 266 will generally only occur under particular conditions. The conditions can include certain conditions of a motherboard or other system board, a certain frequency of operation and/or communication, and/or some other operation parameter of system 200, in addition to a sequence of back-to-back commands. Training logic 230 enables device 210 to train the interface, meaning that device 210 can identify the sequences of commands that have a potential for causing reflections.

In one embodiment, training logic 230 is triggered during normal training of the operating parameters of the I/O interface between the devices. In one embodiment, system 200 enables training logic 230 at specified times to determine the operation of the I/O interface. In one embodiment, training logic 230 includes a mechanism to detect reflections. In one embodiment, training logic 230 operates when DQS 266 is determined to be free of noise. For example, in certain operations, the data interface is quiet for relatively long periods of time (i.e., enough time for reflections to die out), and it is at the times that the line will be free of noise that training logic 230 operates to train when reflections appear, and/or to measure specific operation of the I/O interface. Reflections can take several clock cycles to return, and certain patterns are more likely than others to cause false sampling.

In one embodiment, training logic 230 performs a special training procedure to determine turnarounds between which commands have a risk to be affected by reflections. In one embodiment, the control logic in charge of generating sequences of commands and receiving signals (e.g., a memory controller, processing device, or other control logic) avoids the identified turnaround timings by preventing the use of certain command sequences. This control logic will be identified below as transceiver logic.

In one embodiment, training logic 230 uses sample detection, by causing the transceiver logic to issue a pulse on the strobe signal line, and a reflection on the line will cause the DQS receiver to generate a pulse. Device 210 will detect the generated pulse if the receive enable is active or on. In one embodiment, training logic 230 executes a training sequence to move the receive enable one clock fraction at a time to detect when the echo is present. The receive enable can be moved forward in time or backward in time, depending on the implementation (determining when the reflection appears, or determining when the reflection stops appearing). The detection logic of the transceiver logic can include setting a latch to zero, and configuring it to sample a one if receive enable is on and a pulse is detected on DQS.

In one embodiment, training logic 230 can employ a TDR (Time Domain Reflectometry)-like method. With TDR, the transceiver logic can issue a single pulse on the strobe signal and sample its reflections as they return from the channel. TDR requires a special circuit in the I/O buffers as well as algorithms to analyze the results.

In one embodiment, training logic 230 can measure reflections using existing circuitry for Read Leveling (RcvEn—Receive Enable Training). The transceiver logic can generate two spaced out Read transactions, while the leaker circuit is operated at sub-optimal levels to detect somewhat weaker reflections than it normally could overcome. The existing circuit would sample the DQS state when the RcvEn signal is rising. The system can then sweep back the RcvEn timing for a second, subsequent Read transaction until it reaches the end of the first Read transaction. Thus, the system can monitor the I/O to determine when a reflection caused by the first transaction fails to affect a second or subsequent transaction.

The system can then rebuild and analyze the DQS waveform from the samples. Thus, the system can identify problematic Read to Read turnaround times. For example, consider the case where two Read signals spaced by 10 DCLK cycles are issued. The "bubble" between the Data bursts is 10−4=6 DCLK cycles (the burst length in this example is 8; i.e., 4 DCLK cycles). Thus, the system can sweep back RcvEn timing up to 6 DCLK cycles backwards, and record the sampled DQS. The DCLK cycle in which the last reflection from the first Read will indicate the minimal legal turnaround timing allowed for the system for the transactions. Thus, the transceiver logic configures its operation to obey the determined minimal legal turnaround time for the transactions. Training does not require any additional circuits in the I/O path, and can be implemented by a training program/algorithm in the control logic.

The training characterizes noise patterns for the system. Based on the characterized noise patterns, the system can determine when reflections are expected based on the measurements. The measurements can be performed by count logic. Count logic can also be used in operation to count a number of pulses or a number of bursts at which point a reflection is to be expected. Then the control logic can prevent sending transactions at times when the reflections are expected on the strobe line. By not sending during the expected noisy times, the system can avoid sending commands during periods where the presence of noise is likely to result in false sampling.

In LPDDR3, the time, referred to as tDQSCK, between a Read command and the actual data has a significant variance. The specification specifies the memory device to generate a preamble of at least 0.9 DCLK (data clock cycles) at the beginning of a Read transaction. However, the tolerance for drift in tDQSCK (the range of variance in timing allowed by specification) is larger than the preamble length. Thus, receive buffer 270 and corresponding receive sense amplifiers are typically opened in accordance with an earliest possible tDQSCK timing, which can be prior to the preamble. Strong reflections can overcome the leaker circuit while the sense amplifiers are opened and device 210 is ready to sample. Thus, device 210 could sample noise resulting in hard failure, without the use of one or a combination of multiple of the mechanisms described to avoid false sampling.

Figure 3:
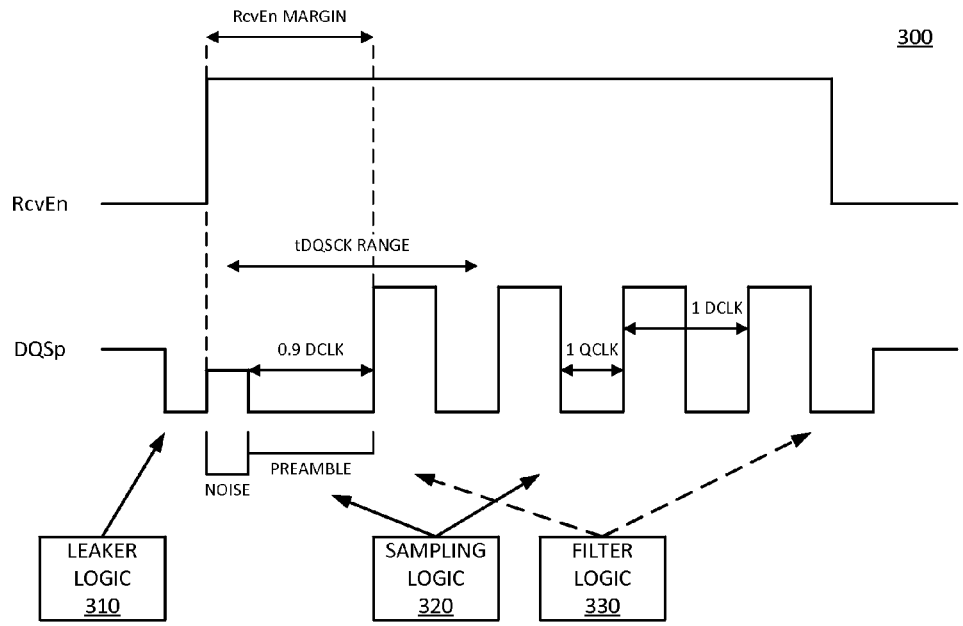
FIG. 3 is a timing diagram for an embodiment of a system that uses sampling and filter logic to identify a valid sampling edge on a data strobe line.

FIG. 3 is a timing diagram for an embodiment of a system that uses sampling and filter logic to identify a valid sampling edge on a data strobe line. Timing diagram 300 can represent one example of a timing diagram in accordance with an embodiment of system 100 of FIG. 1, or system 200 of FIG. 2. RcvEn represents a receive enable signal that is triggered prior to an earliest possible time when data could be presented on a data line (DQ—not shown). The earliest possible time data could be presented is represented by the left arrow of the tDQSCK range indicator. DQSp represents a strobe signal or strobe line for p-type sensing circuitry that will sample the data line.

As illustrated, leaker logic 310 triggers a leaker circuit to normalize the DQSp signal line by pulling it low, which is the same direction the transmitting device will drive the subsequent preamble. The half-pulse on DQSp prior to the preamble represents noise or a reflection that can cause a false sampling of the data line, since receive enable is active when the noise appears on the strobe line. Sampling logic 320 samples the data line in accordance with pulses that appear on DQSp. The intended pulses occur after the preamble. However, sampling logic 320 can also generate a sample based on the noise. The receive enable signal is active through the data burst. A period of RcvEn margin, which extends from when the signal is activated until the initial valid edge of the sampling strobe is received, can vary as tDQSCK varies.

Filter logic 330 represents one or more processing mechanisms used to avoid false sampling after the sample has already been buffered. Assuming the noise caused sampling logic 320 to record a sample prior to the preamble, filter logic 330 can eliminate the false sample. As illustrated, diagram 300 illustrates timing with respect to an LPDDR3 implementation, and will be understood as merely one example. In diagram 300, a proper pulse includes a falling edge and a rising edge that are separated by 1 QCLK (system clock, 0.5 DCLK), and there should be 1 DCLK between two edges of the sample type (or 1 DCLK between pulses). The preamble is at least 0.9 DCLK. All timing values are allowed a variance or tolerance provided by the specification.

In one embodiment, a system having an interface with timing diagram 300 can detect and reject false samples by detecting false pulses based on timing. As shown, the preamble has a length of at least 0.9 DCLK (1.8 QCLK), and during this time the line is driven hard low, which will suppress reflections. The system can implement false pulse detection by tracking silence on DQS that is more than a transition time (plus tolerance), and remove the false data samples before the control logic (e.g., memory controller or processing device) reads the samples from the receive buffer.

In one embodiment, the system detects a false pulse by using a counter to measure the time between pulses or edges. Even providing for tolerance, a valid DQS transition should not arrive more than, for example, 1.1 QCLK from the previous transition. On the other hand, when receive detection logic detects the preamble, the transition should be at least 1.8 QCLK (0.9 DCLK) from any noise edge to the first valid DQS transition. Therefore, the system can measure (e.g., via a count or other mechanism) a transition detected T period after a previous transition, and compare T to expected transitions. T identifies an invalid transition if it is too great. Detection of a preamble also indicates that samples generated before the preamble were false sample. Thus, for 1.1 QCLK<T, T indicates filter logic 330 (part of the receive logic) should look for a false sample in the receive buffer. In one embodiment, the system ignores and/or eliminates samples generated prior to the initial valid edge, as indicated by detection of preamble timing. Thus, the system can include count logic to identify time intervals between pulses/edges, and identify valid pulses/edges based on the measured times aligning with expected time intervals as provided by specification.

In one embodiment, a system having an interface with timing diagram 300 can detect and reject false samples by detecting false pulses based on a number of samples, which is described in more detail below with FIG. 5. The timing indicated above could be used by count logic to detect a number of samples (based on detecting a number of pulses/edges).

The first approach would be challenging to actually implement. It involves looking at the timing between edges, or the distance between edge intervals. In this one, you capture all the data, filter it, and then toss the data that is deemed to have been falsely sampled. The FIFO can be twice the length of an expected burst. This method is challenging in that it is hard to process the data fast enough.

The second approach is to count the pulses that come across the data strobe line, and then only keep the final eight pulses. This one is also challenging because you cannot get to the next read too soon, and so you would need to separate the reads by a one cycle penalty bubble.

Figure 4:
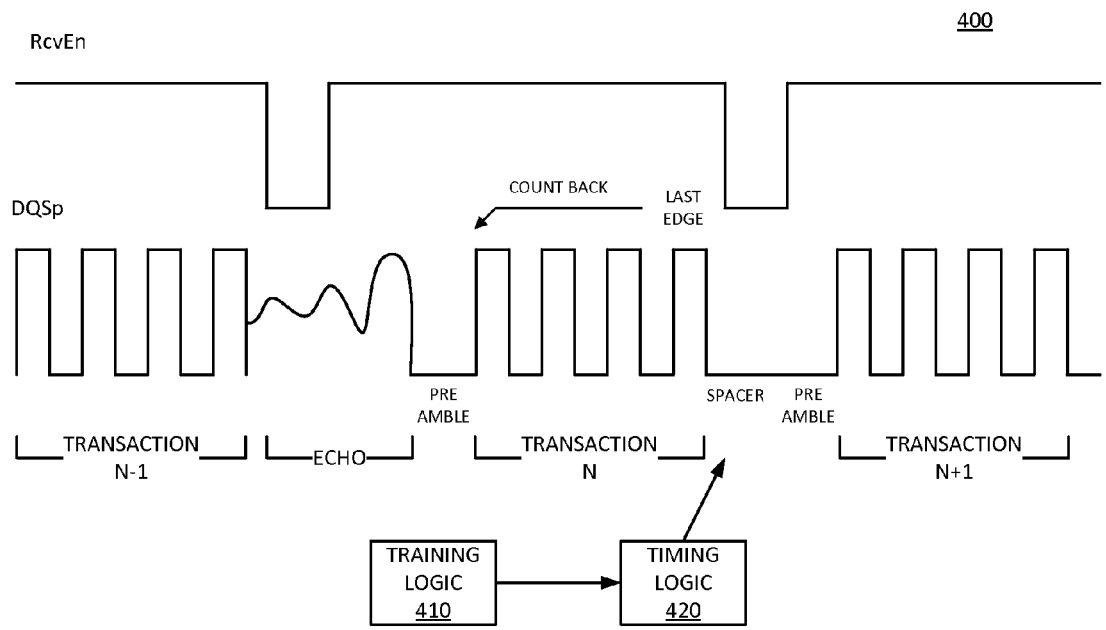
FIG. 4 is a timing diagram for an embodiment of a system that spaces receive commands based on an expectation of reflections on a data strobe line.

FIG. 4 is a timing diagram for an embodiment of a system that spaces receive commands based on an expectation of reflections on a data strobe line. Timing diagram 400 can represent one example of a timing diagram in accordance with an embodiment of system 100 of FIG. 1, or system 200 of FIG. 2. RcvEn again represents a receive enable signal that is triggered prior to an earliest possible time when data presented on a data line (DQ—not shown). DQSp represents a strobe signal or strobe line for p-type sensing circuitry that will sample the data line.

Multiple transactions or bursts are illustrated on DQSp. Each burst includes an expected number of pulses/edges. Receive Enable is active for the period of each burst, and is reset between transactions. As shown, transaction N−1 generates a reflection or echo, which can cause false sampling in transaction N. In one embodiment, control logic that controls sending commands and receiving data in response to the commands (which can be a memory controller for a memory device). For purposes of example in the description, the control logic will be considered to be part of a memory controller, and will simply be referred to as the memory controller.

In one embodiment, the memory controller delays a subsequent transaction, transaction N+1 by one or more clock cycles, e.g., one DCLK cycle, if transaction N+1 follows back to back to current transaction N. The number of strobes or pulses per command is provided by specification. If more pulses are sampled in current transaction N than what is specified in the specification, a FIFO read pointer can point to the last number of expected entries, ignoring any extra samples in the beginning that may be present.

Training logic 410 can be an example of training logic in accordance with any embodiment described. Thus, in one embodiment, training logic 410 can be used to determine characteristic timing, which the memory controller can then use to affect the timing of how it generates transactions. Thus, for example, timing logic 420, which represents any logic or portion of logic, can affect the timing of when the system sends additional transactions. In one embodiment, the system insert a spacer between transactions N and N+1, to allow time to process the samples taken during transaction N, and avoid erroneous data due to the echo. The spacer can allow the system to more easily detect the end of the burst of transaction N, and then count back an expected number of pulses/edges (e.g., eight edges in system 400) from the last received edge to identify the initial valid edge and the other valid edges. Thus, the system can identify the valid samples recorded in the receive buffer.

Both the mechanisms for counting the timing of the transaction pulses/edges, as well as the mechanism of counting the number of pulses/edge will use logic to count. One example embodiment of logic that could be used to implement these mechanisms is described below with respect to FIG. 5.

Figure 5:
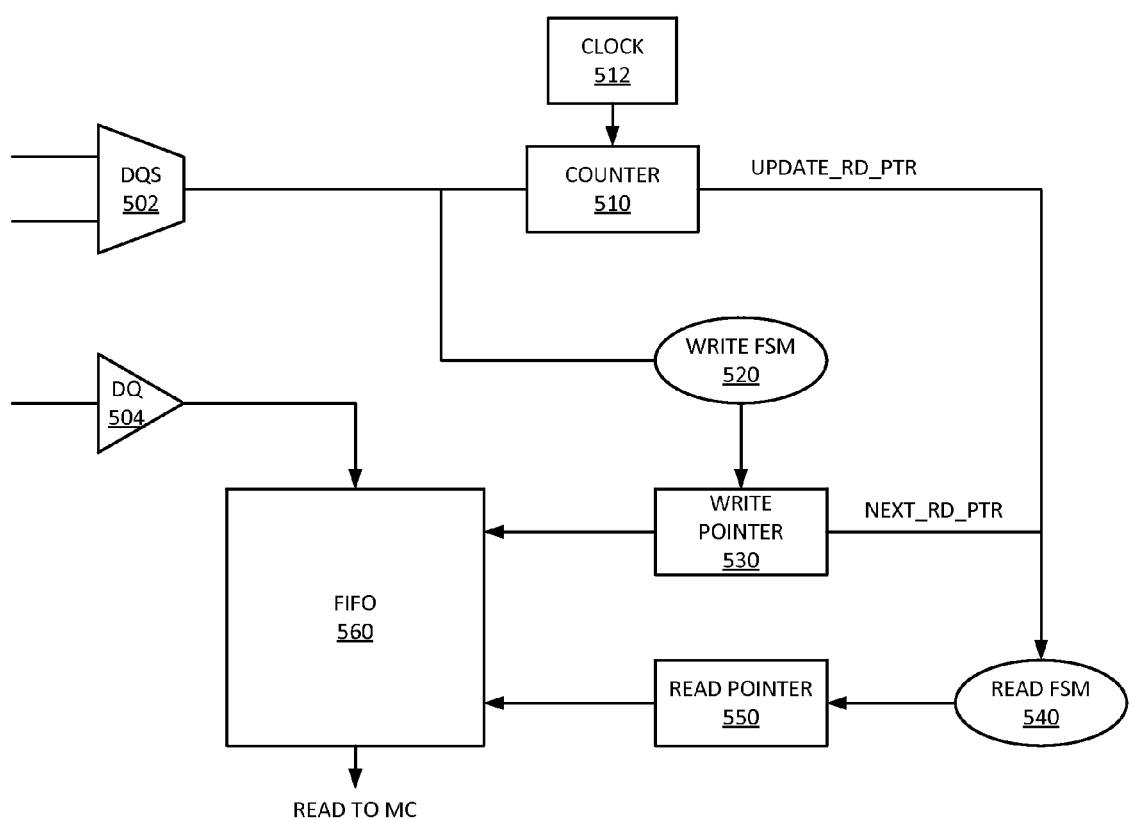
FIG. 5 is a block diagram of an embodiment of logic to count sampling edges.

FIG. 5 is a block diagram of an embodiment of logic to count sampling edges. System 500 represents a detector implementation that can measure delay or count timing. System 500 can be implemented in the I/O interfaces, for example, of system 100 of FIG. 1 or system 200 of FIG. 2. System 500 receives data signal DQ 504 and data strobe signal DQS 502. In one embodiment, DQS 502 includes a complementary as well as a primary signal. System 500 buffers input data DQ 504, and can process the data to avoid false samples from invalid sampling strobes.

It will be understood that there are several ways to measure delay, which can be alternatives in system 500. As illustrated, system 500 includes clock 512 that controls counter 510. Alternatively, system 500 could include a DLL (delay locked loop, not shown). System 500 could initiate the DLL from one DQS transition and poll a third quadrant signal to detect when a certain amount of time has passed (e.g., 1.5 QCLK, as discussed below). Where clock 512 is used, in one embodiment, clock 512 is a fast clock. With a fast clock 512, the system digitizes the delay and a transition can arrive just before or after the sampling edge with 0 to 1 cycle of error.

Measuring delay with a 4×DCLK (Q2CLK) on rise and fall could lose half a QCLK phase. In one embodiment, a valid transition interval will measure 3 to 5 Q2CLK phases; thus, a number of phases more than 5 would indicate false transitions occurred. Other clock speeds can be used. It will be understood that selection of the speed of clock 512 should consider what clock speed is needed to allow enough measurement resolution to distinguish valid from invalid intervals.

In one embodiment, once a receive enable signal (RCV_EN) is set, DQS delay detection logic 500 is enabled. In one embodiment, clock 512 is a Q2CLK, which operates at four times DCLK. Thus, each Q2CLK cycle measures 0.25 DCLK. As mentioned previously, in one embodiment, a valid transition can be up to 1.1 DCLK. Thus, if the logic of system 500 determines if a DQS transition is longer than 5 phases of Q2CLK, it is a total of 1.25 DCLK, and cannot be a valid transition. Thus, system 500 can issue a false DQS detected signal (update_rd_ptr). If system 500 detects a false pulse, the update_rd_ptr will cause the next read from FIFO 560 to start from the current DQS sample, and ignore the previous false samples.

For example, counter 510 receives and evaluates DQS 502 to determine if the interval is longer than allowed (such as 5 Q2CLK cycles). If counter 510 detects an error, it generates update_rd_ptr. Otherwise, the strobe signal is fed into write FSM (finite state machine) 520. The strobe signal triggers the states in write FSM 520, which can then direct write pointer 530 forward in FIFO 560 to record the next sample of DQ 504. Updating write pointer 530 can also update read FSM 540 consistent with where write FSM 520 is writing. It will be understood that write FSM 520 simply directs the buffer where to write, and is agnostic to whether a sample is false or valid. However, false samples can be written based on an invalid strobe.

Thus, counter 510 can count a number of phases and issue a read pointer correction if a false sampling strobe is detected. Update_rd_pointer can set read pointer 550 from read FSM 540 to avoid reading the false samples stored in FIFO 560. Instead, read FSM 540 can be updated to skip the erroneous entries. FIFO 560 reads the data out to a memory controller (MC) or other control device, based on the location of read pointer 550. It will be understood that essentially the logic circuit of system 500 tries to determine if the first strobe is valid. The next strobe cannot be more than a certain number of cycles or it cannot be a valid strobe, based on timing constraints of a specification.

It will be understood that instead of reading the timing between the strobes/edges, the logic of system 500 can be modified to count pulses/edges. In such an embodiment, clock 512 would either not be needed, or would at least not need to be a fast clock. The logic of system 500 could also be used to train the I/O interface (which could use a fast clock 512). Instead of reading data into FIFO 560, training could simply take the outputs of the logic that detect the timing of the received pulses and/or reflections.

Figure 6:
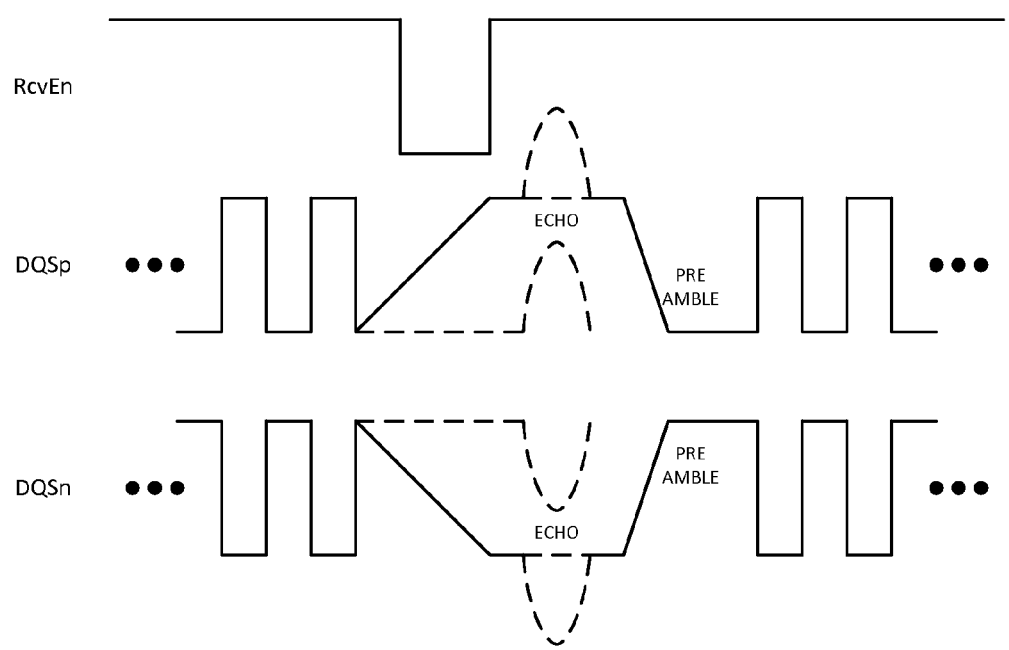
FIG. 6 is a timing diagram for an embodiment of a system with reversed data strobe line normalization logic.

FIG. 6 is a timing diagram for an embodiment of a system with reversed data strobe line normalization logic. Diagram 600 represents a timing characterization of a system with a reversed leaker. A leaker or normalizer circuit was originally used to guarantee that prior to receiving a preamble, the strobe line state was driven to the voltage rail of the preamble. However, by inversing the circuitry, the leaker can place the strobe line in a state opposite the state the preamble will put it in. Since reflections that cause false sampling also have the reverse polarity as the preamble, placing the strobe line in the reversed state prior to the preamble means that echoes will not affect the state.

Diagram 600 illustrates both a DQSp and a DQSn signal. Receive enable is opened after the leaker circuit is engaged, as before. But as illustrated, the reversed leaker will drive the respective DQS lines to a state opposite their preamble states. Thus, echoes are ignored, and the system always counts a first pulse prior to sampling valid data. In one embodiment, the logic of FIG. 5 could also be used to count the single "leaker pulse" that precedes the preamble, and would always ignore samples associated with the first "leaker pulse." Thus, the system guarantees sampling on the initial valid pulse of the strobe line.

In one embodiment, the leaker circuit is implemented as a weak pull up or a weak pull down. As illustrated, the reverse leaker on DQSp could be a weak pull up, while the reverse leaker on DQSn could be a weak pull down.

Figure 7A:
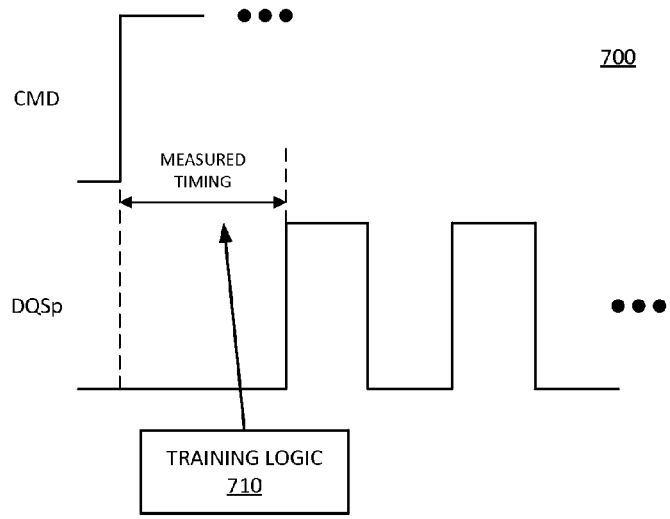
FIGS. 7A-7B are timing diagrams for an embodiment of a system that measures a specific valid sampling time, and applies the measured time to detect valid sampling edges in subsequent bursts.
Figure 7B:
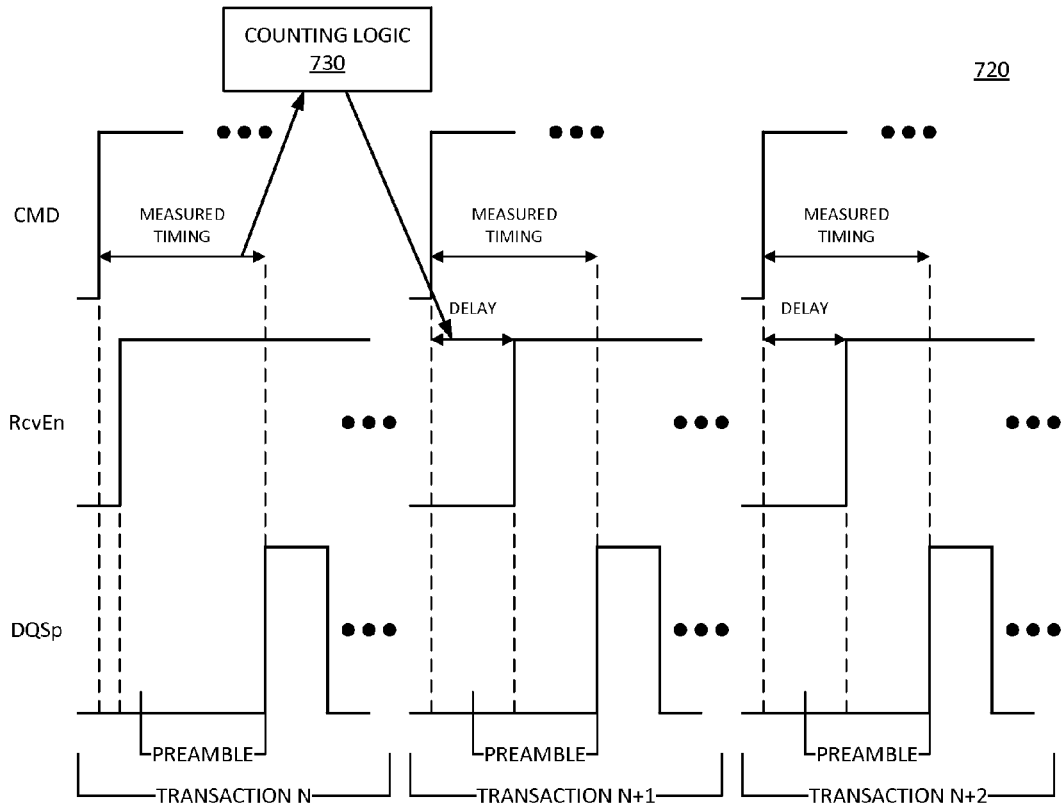

FIGS. 7A-7B are timing diagrams for an embodiment of a system that measures a specific valid sampling time, and applies the measured time to detect valid sampling edges in subsequent bursts within a predefined timing window. Referring to FIG. 7A, timing diagram 700 illustrates a timing measured between a time a command is sent to when an initial valid pulse is received on DQSp (which could also be done DQSn, as will be understood by the skilled reader). The measured timing or measured value is F(tDQSCK) (a function of tDQSCK), and represents a specific value for the specific I/O interface or specific system in which the I/O is exchanged. While referred to as tDQSCK, it will be understood that the actual timing measured could be tDQSCK plus a Read latency as defined by standard and/or another delay characteristic to the operation of the I/O interface. For purposes of simplicity, the entire timing will be referred to as "tDQSCK" as a shorthand for all delay times before the first pulse is received. Contrasting with FIG. 3 where it was indicated that tDQSCK can drift and is not known, in one embodiment, the system specifically characterizes the tDQSCK of the I/O interface with training logic 710. In one embodiment, training logic 710 can include logic similar to logic 500 of FIG. 5 to make the measurements. In one embodiment, training logic 710 includes a sufficiently fast clock to characterize tDQSCK to sufficient resolution. Alternatively, the training logic could use a DLL or other delay counter mechanism.

Training logic 720 trains the specific delay for the system at a point when the strobe line has no noise or reflections on it. In one embodiment, there is a specified delay in which the line is quiet, and is sufficiently long for all reflections to die out. In one embodiment, the system could selectively enable strong termination to actively quiet the strobe line to prepare for training. In either case, the strobe line will be quiet, and the first pulse received is the first valid pulse. Based on the timing to the first valid pulse, the system can then characterize the timing to be used for subsequent transactions to guarantee opening receive enable during the preamble.

Referring to FIG. 7B, counting logic 730 in receiving logic of the I/O interface can use the measured timing to determine when to trigger the receive enable signal and allow the interface to begin sampling data. Timing diagram 720 illustrates the command signal line state, the receive enable signal line state, as well as the state of DQSp for which tDQSCK was measured. It will be understood that with a known specific measured timing, the system can open receive enable during the preamble, instead of opening it prior to the preamble to account for worst case drift. Thus, there will be a guarantee of no noise on the DQSp strobe line when sampling, because the sampling will only start during the preamble period. As illustrated, the system opens RcvEn prior to the preamble in the first transaction and calculates the measured timing.

As illustrated, the measured timing can be used for subsequent bursts or transactions, given that the drift of tDQSCK between subsequent transactions is expected (by specification) to be minimal. With a stable, known tDQSCK value or measured timing, counting logic 730 or other receive detection logic simply needs to count based on tDQSCK to determine when to open receive enable. In one embodiment, counting logic 730 counts a delay period from the command signal, and opens receive enable after the delay. Thus, the system can introduce an appropriate delay in a subsequent transaction to ensure opening the receive enable during the preamble. In one embodiment, counting logic 730 (which can be referred to as or be part of a dynamic tracking engine for diagram 720) adjusts receive enable to follow the last detected DQS edge with some margin. Again referring to LPDDR3 as one example, the specification allows very little drift of tDQSCK within a 160 nsec period. For all transactions during the 160 nsec period, the system can use the measured tDQSCK value to open the receiver buffer during the preamble and not before it.

It will be understood that the pulse timing could also drift left with reference to the timing diagram. Thus, when measuring the measured timing (FIG. 7A or the first transaction in FIG. 7B), the system can make sure to open the receive enable prior to the preamble to ensure capturing the first edge time. In one embodiment, the timing is based on measuring the receive enable signal to the first DQS edge, rather than from the command signal to the first DQS edge (which could be easier to implement). The timing between the receive enable signal and the first edge can be measured as a delta between the receive enable time and the time of the first DQS edge. Mathematically, the receive enable time can be expressed as: RcvEnTime=(Read Latency)+(MC Delay), where the read latency is constant per the speed at which the I/O interface is operated, and the MC delay represents a memory controller time that is constant per DQS after training. The first DQS edge time can be expressed as: 1stDQSEdge=(Read Latency)+(Board flight time)+ tDQSCK, where the read latency is the same value as for RcvEnTime, board flight time is a constant per platform per DQS that indicates a time for the signal to travel, and tDQSCK can drift. Thus, the delta can be expressed as: Delta=(Board flight time)+tDQSCK−(MC Delay).

In one embodiment, training logic 710 includes a circuit to measure the relative delay between the time the system opens receive enable and the time the first pulse arrives on DQS. As before, training logic 710 performs the measurement when the line is guaranteed to be quiet (i.e., no reflections). Based on the measurement, the system can characterize the delay for the first or initial valid pulse/edge of all transactions, and use the same timing on subsequent transactions. In one embodiment, counting logic 730 can adjust the opening of receive enable to follow the last detected DQS edge with some margin. In one embodiment, counting logic 730 can dynamically track DQS drift to adjust subsequent RcvEn timing.

If more than 160 nsec (or some other specified time period for an I/O specification) has passed since the last transaction, counting logic 730 can automatically revert to the original early receive enable setting which accommodates the full range of DQS drift. The system can then again measure the relative delay and adjust receive enable timing for subsequent transactions, in accordance with what is described above. It could be understood that dynamic tracking takes a somewhat asynchronous read (asynchronous in that the timing of the device is not precisely aligned, and the timing of the data arriving is not precisely known), and makes the timing determinative. Thus, the system can then predict, more akin to a synchronous system, when the data should arrive. In effect, dynamic tracking can be said to overlay synchronicity over a system that is not perfectly synchronous.

FIGS. 8A-8E are flow diagrams of embodiments of avoiding false sampling due to noise on a data strobe line. FIGS. 8A-8E illustrate different embodiments of avoiding false sampling that could all be used separately. In one embodiment, one or more of the described techniques can be combined.

Figure 8A:
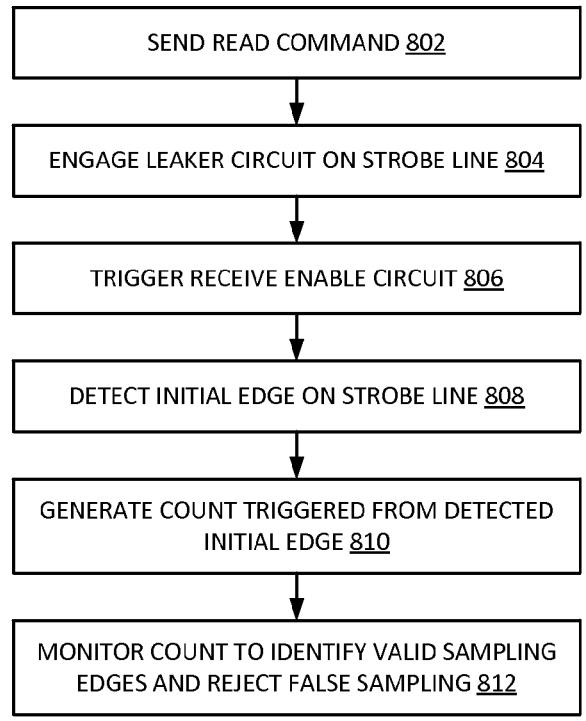
FIGS. 8A-8E are flow diagrams of embodiments of avoiding false sampling due to noise on a data strobe line.

Referring to FIG. 8A, in one embodiment, a system monitors the timing between strobes and/or edges of the strobe line to determine if sampled data is valid (i.e., if it was sampled based on a valid sampling edge). The I/O interface sends a read command, 802, and expects data in response to the read command. In one embodiment, the system engages a leaker or normalization circuit on the strobe line at some point after sending the command, or concurrently with sending the command, 804. In one embodiment, the leaker circuit is a reverse leaker circuit as described above. Thus, the leaker circuit can drive the strobe line the opposite direction of a preamble. The receiving device also triggers a receive enable circuit, 806, which enables a receive buffer.

In one embodiment, the receiving device detects a first or initial edge on the strobe line, 808. Depending on the configuration of the system, the initial edge could be an echo, and thus a false sampling pulse. In one embodiment, the receiving device generates a count triggered from the detected initial edge, 810. The receiving device can determine if the initial edge is a valid initial edge or the result of noise. The receiving device monitors the count to identify valid sampling edges and reject false sampling, 812. In one embodiment where a reverse leaker circuit is applied, the count can be a count of the initial pulse, which is the "leaker pulse," and subsequent pulses in the burst are expected to be valid.

Figure 8B:
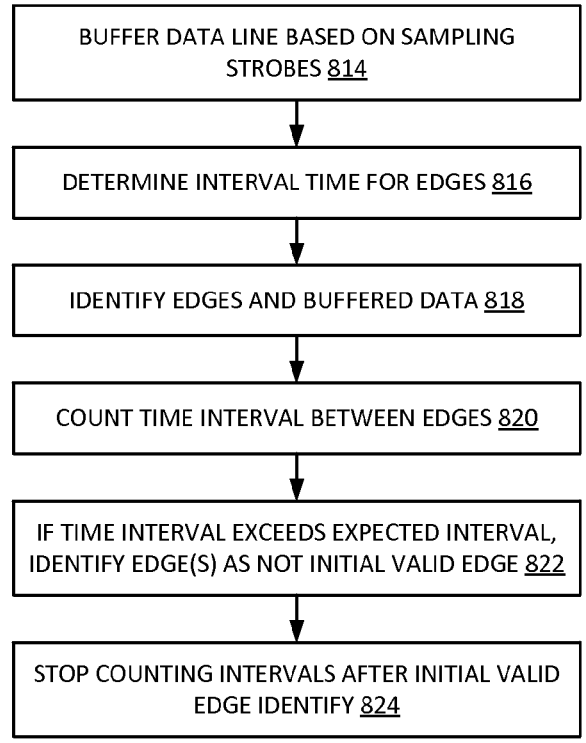

Referring to FIG. 8B, the receiving device buffers a data line associated with the sampling strobe, based on the sampling edges, 814. In one embodiment, the receiving device determines an interval timing expected for the sampling edge, 816. For example, timing can be specified in a specification or the I/O interface. Based on the expected timing, the receiving device can identify edges based on the strobe line that correspond with samples in the data buffer, 818. In one embodiment, the receiving device includes logic to count a time interval between edges, 820. Alternatively, the receiving device can count a time interval between pulses. The receiving device compares the measured interval(s) to expected timing. If the time interval exceeds the expected time interval, the receiving device can identify one or more edges as invalid, and in particular can identify a first received edge or edges as not being the initial valid edge, 822. In one embodiment, the counting logic stops counting intervals after an initial valid edge is identified or after an initial invalid edge is identified (assuming only a single invalid edge would be present), 824. The receiving device can ignore and/or remove data sampled based on an invalid sampling edge.

Figure 8C:
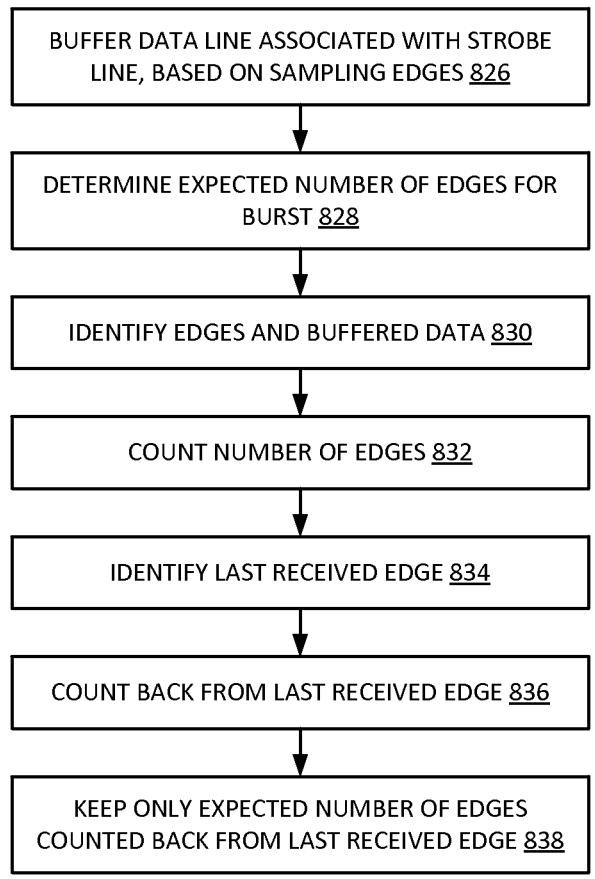

Referring to FIG. 8C, the receiving device buffers data from a data line associated with the data strobe line, 826. In one embodiment, the receiving device determines an expected number of edges expected in a data burst or transaction, 828. In one embodiment, the receiving device identifies the edges via receive circuitry, and identifies data buffered based on those edges, 830. In one embodiment, the receiving device counts the number of edges detected on the strobe line during the transaction, 832. The receiving device identifies the last received edge to know when to stop counting edges for the transaction, 834. In one embodiment, the receiving device spaces commands out with a spacer to ensure the ability to detect what edge is the last edge of the transaction, instead of having the next transaction come back to back. In one embodiment, the receiving device compares the detected number of edges with the expected number of edges for the transaction or burst to see if they are different. In one embodiment, the receiving device counts back from the identified last received edge, counting until the expected number of edges is identified, 836. In one embodiment, the receiving device keeps only a number of samples corresponding to the expected number of edges, counted back from the last received edge and corresponding last recorded sample, 838.

Figure 8D:
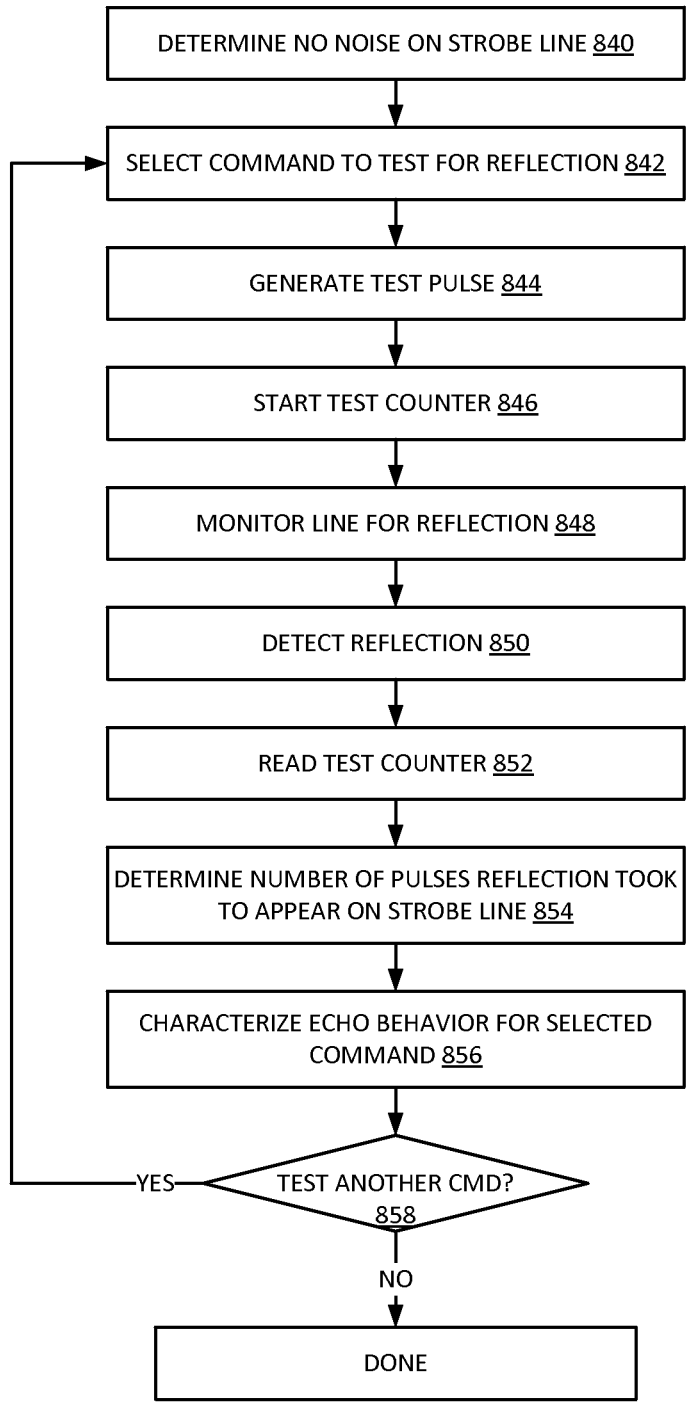

Referring to FIG. 8D, in one embodiment, the receiving device trains the I/O interface to characterize the echo behavior of the system. The receiving device trains the I/O interface when there is no noise on the strobe line, 840. By "no noise," it is understood that it is not likely possible to avoid all noise; rather, "no noise" refers to not having noise with sufficient energy to trigger a false sample. In one embodiment, the receiving device waits a period of time to allow the strobe line to quiet down. Alternatively, the receiving device can active silence the line with selectively applied strong termination.

In one embodiment, the receiving device tests multiple different commands and/or multiple commands in different combinations to determine how the combination of commands affects the data strobe line with respect to reflections or echoes. Thus, in one embodiment, the system selects a command to test for reflection, 842. The receiving device generates a test command, which can be a full command or just a test pulse on the strobe line, 844. The receiving device starts a counter or other measurement mechanism, 846, and monitors the strobe line for reflections in response to the test signal, 848. Reflections can take a number of cycles to arrive.

The receiving device detects a reflection, if there is any, for the particular command or command sequence, 850. If there is a reflection, the receiving device can read the test counter, 852, to determine how many counts or pulses the reflection took to appear on the strobe line at the receiving device, 854. The receiving device can use the information on the timing of the reflection to characterize the echo behavior for the selected command or command sequence, 856. The receiving device can add spacing and/or avoid sequences that cause reflection issues. If the receiving device wants to train further commands or command sequences, 858 YES branch, the process returns to 842. If the receiving device is finished training, 858 NO branch, the training process is done.

Figure 8E:
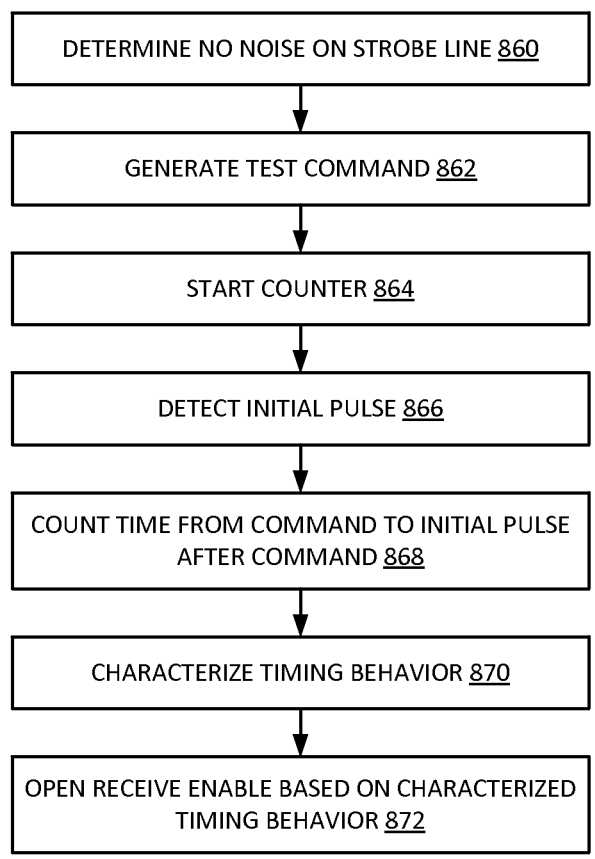

Referring to FIG. 8E, in one embodiment, a receiving device performs dynamic tracking. Similar to what is described with reference to FIG. 8D, the receiving device can determine that there is no noise on the strobe line, 860. The receiving device generates a test command or test pulse, 862. In response to sending the command, the receiving device can start a counter or other delay detection mechanism, 864. The receiving device also triggers receive enable. The receiving device detects an initial pulse on the strobe line at some time after sending the command, 866. In one embodiment, the receiving device counts the time from the command to the initial pulse, 868. The receiving device could also or alternatively count the time from triggering receive enable until the initial pulse. The receiving device knows how long the preamble is, and can simply adjust the timing of triggering the receive enable to fall within the preamble, if it is initially enabled prior to the preamble. Thus, the receiving device characterizes the timing behavior of the initial pulse with respect to the behavior of the receiving device (e.g., time from RCV_EN, or time from CMD), 870. Subsequently, the receiving device will open receive enable based on the characterized timing behavior to ensure that it opens during the preamble, 872.

Figure 9:
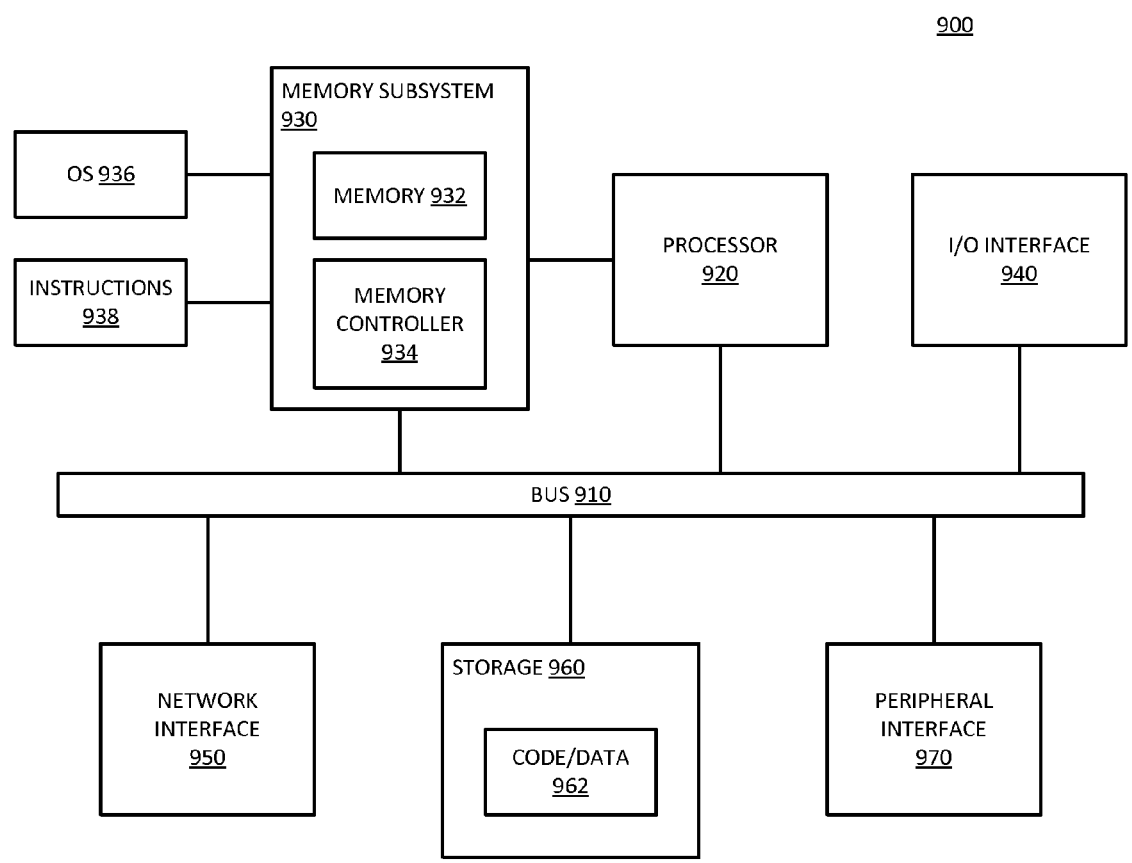
FIG. 9 is a block diagram of an embodiment of a computing system in which false sampling avoidance can be implemented.

FIG. 9 is a block diagram of an embodiment of a computing system in which false sampling avoidance can be implemented. System 900 represents a computing device in accordance with any embodiment described herein, and can be a laptop computer, a desktop computer, a server, a gaming or entertainment control system, a scanner, copier, printer, routing or switching device, or other electronic device. System 900 includes processor 920, which provides processing, operation management, and execution of instructions for system 900. Processor 920 can include any type of microprocessor, central processing unit (CPU), processing core, or other processing hardware to provide processing for system 900. Processor 920 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 930 represents the main memory of system 900, and provides temporary storage for code to be executed by processor 920, or data values to be used in executing a routine. Memory subsystem 930 can include one or more memory devices such as read-only memory (ROM), flash memory, one or more varieties of random access memory (RAM), or other memory devices, or a combination of such devices. Memory subsystem 930 stores and hosts, among other things, operating system (OS) 936 to provide a software platform for execution of instructions in system 900. Additionally, other instructions 938 are stored and executed from memory subsystem 930 to provide the logic and the processing of system 900. OS 936 and instructions 938 are executed by processor 920. Memory subsystem 930 includes one or more memory devices 932 where it stores data, instructions, programs, or other items. In one embodiment, memory subsystem includes memory controller 934, which is a memory controller to generate and issue commands to memory device 932. It will be understood that memory controller 934 could be a physical part of processor 920.

Processor 920 and memory subsystem 930 are coupled to bus/bus system 910. Bus 910 is an abstraction that represents any one or more separate physical buses, communication lines/interfaces, and/or point-to-point connections, connected by appropriate bridges, adapters, and/or controllers. Therefore, bus 910 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 910 can also correspond to interfaces in network interface 950.

System 900 also includes one or more input/output (I/O) interface(s) 940, network interface 950, one or more internal mass storage device(s) 960, and peripheral interface 970 coupled to bus 910. I/O interface 940 can include one or more interface components through which a user interacts with system 900 (e.g., video, audio, and/or alphanumeric interfacing). Network interface 950 provides system 900 the ability to communicate with remote devices (e.g., servers, other computing devices) over one or more networks. Network interface 950 can include an Ethernet adapter, wireless interconnection components, USB (universal serial bus), or other wired or wireless standards-based or proprietary interfaces.

Storage 960 can be or include any conventional medium for storing large amounts of data in a nonvolatile manner, such as one or more magnetic, solid state, or optical based disks, or a combination. Storage 960 holds code or instructions and data 962 in a persistent state (i.e., the value is retained despite interruption of power to system 900). Storage 960 can be generically considered to be a "memory," although memory 930 is the executing or operating memory to provide instructions to processor 920. Whereas storage 960 is nonvolatile, memory 930 can include volatile memory (i.e., the value or state of the data is indeterminate if power is interrupted to system 900).

Peripheral interface 970 can include any hardware interface not specifically mentioned above. Peripherals refer generally to devices that connect dependently to system 900. A dependent connection is one where system 900 provides the software and/or hardware platform on which operation executes, and with which a user interacts.

In one embodiment, one or more elements of system 900 include I/O interfaces with other system devices, where the I/O interface is lightly terminated or unterminated. The component of the I/O interface that receives a data signal from the other can implement one or more mechanisms to avoid false sampling caused by reflections on a lightly terminated data strobe line. In one embodiment, the I/O interface applies pulse/edge timing detection to determine if there are false sampling edges to reject. In one embodiment, the I/O interface applies pulse burst length detection to determine a number of pulses/edges that should appear in a single transaction and reject additional pulses/edges, if any. In one embodiment, the I/O interface applies inversed leaker circuitry to drive the line to a voltage rail opposite the preamble, in preparation for receiving the preamble. In one embodiment, the I/O interface applies strobe line training to characterize the noise and/or timing behavior of the interface, and avoid sending transactions that can be negatively impacted by reflections. In one embodiment, the I/O interface applies dynamic timing tracking to open a receive enable only during a preamble to avoid sampling based on reflections. The I/O interface can combine multiples of the mechanisms.

Figure 10:
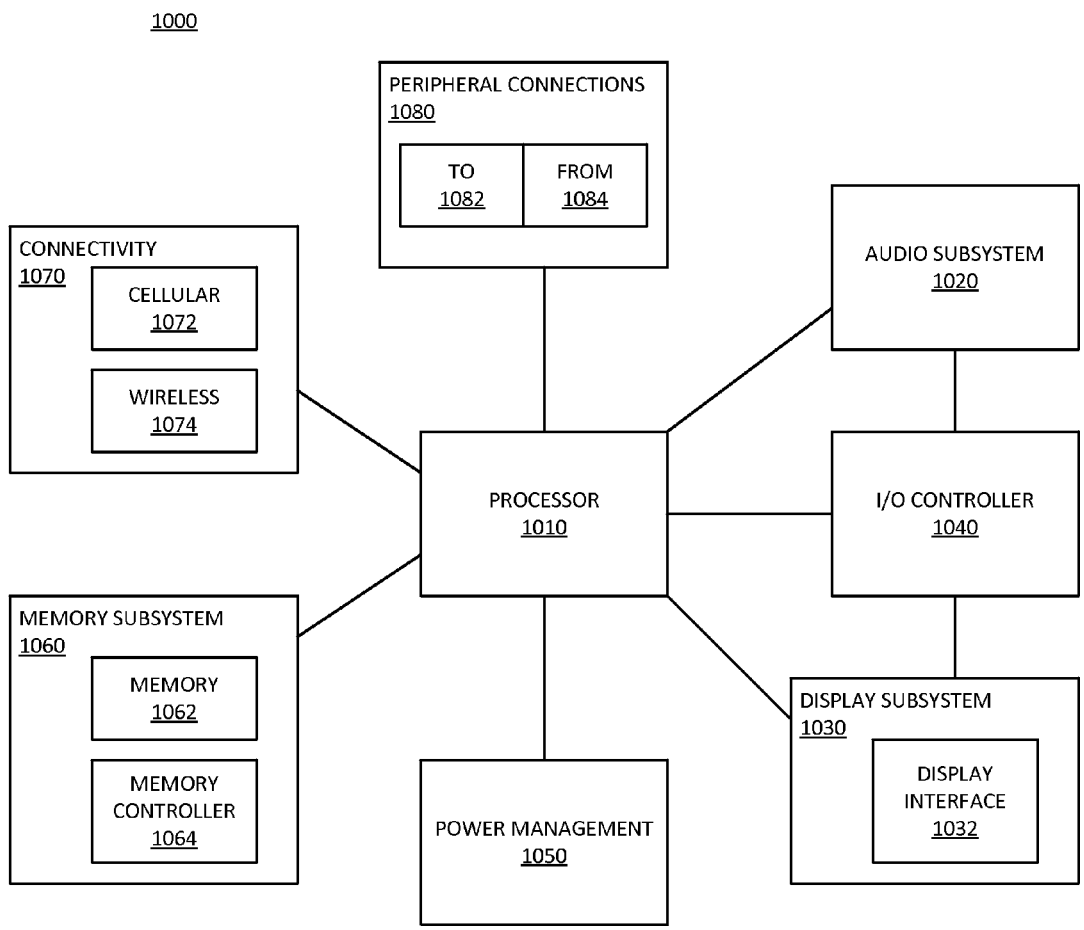
FIG. 10 is a block diagram of an embodiment of a mobile device in which false sampling avoidance can be implemented.

FIG. 10 is a block diagram of an embodiment of a mobile device in which false sampling avoidance can be implemented. Device 1000 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 1000.

Device 1000 includes processor 1010, which performs the primary processing operations of device 1000. Processor 1010 can include one or more physical devices, such as microprocessors, application processors, microcontrollers, programmable logic devices, or other processing means. The processing operations performed by processor 1010 include the execution of an operating platform or operating system on which applications and/or device functions are executed. The processing operations include operations related to I/O (input/output) with a human user or with other devices, operations related to power management, and/or operations related to connecting device 1000 to another device. The processing operations can also include operations related to audio I/O and/or display I/O.

In one embodiment, device 1000 includes audio subsystem 1020, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1000, or connected to device 1000. In one embodiment, a user interacts with device 1000 by providing audio commands that are received and processed by processor 1010.

Display subsystem 1030 represents hardware (e.g., display devices) and software (e.g., drivers) components that provide a visual and/or tactile display for a user to interact with the computing device. Display subsystem 1030 includes display interface 1032, which includes the particular screen or hardware device used to provide a display to a user. In one embodiment, display interface 1032 includes logic separate from processor 1010 to perform at least some processing related to the display. In one embodiment, display subsystem 1030 includes a touchscreen device that provides both output and input to a user.

I/O controller 1040 represents hardware devices and software components related to interaction with a user. I/O controller 1040 can operate to manage hardware that is part of audio subsystem 1020 and/or display subsystem 1030. Additionally, I/O controller 1040 illustrates a connection point for additional devices that connect to device 1000 through which a user might interact with the system. For example, devices that can be attached to device 1000 might include microphone devices, speaker or stereo systems, video systems or other display device, keyboard or keypad devices, or other I/O devices for use with specific applications such as card readers or other devices.

As mentioned above, I/O controller 1040 can interact with audio subsystem 1020 and/or display subsystem 1030. For example, input through a microphone or other audio device can provide input or commands for one or more applications or functions of device 1000. Additionally, audio output can be provided instead of or in addition to display output. In another example, if display subsystem includes a touchscreen, the display device also acts as an input device, which can be at least partially managed by I/O controller 1040. There can also be additional buttons or switches on device 1000 to provide I/O functions managed by I/O controller 1040.

In one embodiment, I/O controller 1040 manages devices such as accelerometers, cameras, light sensors or other environmental sensors, gyroscopes, global positioning system (GPS), or other hardware that can be included in device 1000. The input can be part of direct user interaction, as well as providing environmental input to the system to influence its operations (such as filtering for noise, adjusting displays for brightness detection, applying a flash for a camera, or other features). In one embodiment, device 1000 includes power management 1050 that manages battery power usage, charging of the battery, and features related to power saving operation.

Memory subsystem 1060 includes memory device(s) 1062 for storing information in device 1000. Memory subsystem 1060 can include nonvolatile (state does not change if power to the memory device is interrupted) and/or volatile (state is indeterminate if power to the memory device is interrupted) memory devices. Memory 1060 can store application data, user data, music, photos, documents, or other data, as well as system data (whether long-term or temporary) related to the execution of the applications and functions of system 1000. In one embodiment, memory subsystem 1060 includes memory controller 1064 (which could also be considered part of the control of system 1000, and could potentially be considered part of processor 1010). Memory controller 1064 includes a scheduler to generate and issue commands to memory device 1062.

Connectivity 1070 includes hardware devices (e.g., wireless and/or wired connectors and communication hardware) and software components (e.g., drivers, protocol stacks) to enable device 1000 to communicate with external devices. The external device could be separate devices, such as other computing devices, wireless access points or base stations, as well as peripherals such as headsets, printers, or other devices.

Connectivity 1070 can include multiple different types of connectivity. To generalize, device 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1074 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 1080 include hardware interfaces and connectors, as well as software components (e.g., drivers, protocol stacks) to make peripheral connections. It will be understood that device 1000 could both be a peripheral device ("to" 1082) to other computing devices, as well as have peripheral devices ("from" 1084) connected to it. Device 1000 commonly has a "docking" connector to connect to other computing devices for purposes such as managing (e.g., downloading and/or uploading, changing, synchronizing) content on device 1000. Additionally, a docking connector can allow device 1000 to connect to certain peripherals that allow device 1000 to control content output, for example, to audiovisual or other systems.

In addition to a proprietary docking connector or other proprietary connection hardware, device 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, one or more elements of system 1000 include I/O interfaces with other system devices, where the I/O interface is lightly terminated or unterminated. The component of the I/O interface that receives a data signal from the other can implement one or more mechanisms to avoid false sampling caused by reflections on a lightly terminated data strobe line. In one embodiment, the I/O interface applies pulse/edge timing detection to determine if there are false sampling edges to reject. In one embodiment, the I/O interface applies pulse burst length detection to determine a number of pulses/edges that should appear in a single transaction and reject additional pulses/edges, if any. In one embodiment, the I/O interface applies inversed leaker circuitry to drive the line to a voltage rail opposite the preamble, in preparation for receiving the preamble. In one embodiment, the I/O interface applies strobe line training to characterize the noise and/or timing behavior of the interface, and avoid sending transactions that can be negatively impacted by reflections. In one embodiment, the I/O interface applies dynamic timing tracking to open a receive enable only during a preamble to avoid sampling based on reflections. The I/O interface can combine multiples of the mechanisms.

In one aspect, a method for avoiding false data sampling includes engaging a normalizer circuit on a data strobe line that is not optimally terminated, the data strobe line having a preamble that precedes an initial valid edge, the data strobe line to provide a burst of sampling edges for sampling a data line, where a timing of the initial valid edge can drift within a tolerance, the normalizer circuit to drive the data strobe line to a reference voltage; detecting an initial edge after engaging the normalizer circuit; generating a count triggered from the initial edge; and monitoring the count to identify the initial valid edge of the burst of sampling edges on the data strobe line and reject false sampling caused by noise on the data strobe line.

In one embodiment, a memory controller performs the engaging, detecting, generating, and monitoring of a data strobe line to read data related to a data access request for a memory device. In one embodiment, the noise includes a reflection caused by a signal of a previous communication transaction. In one embodiment, each edge of the burst has a specified time interval, and wherein generating the count comprises generating a count to identify time intervals between strobe edges on the data strobe line and monitoring the count further comprises identifying the initial valid edge based on alignment of sampling edges with the specified timer interval. In one embodiment, the method further includes determining that a sampling edge is not the initial valid edge when a time interval greater than approximately 0.6 times a data clock cycle is detected between edges.

In one embodiment, each burst of sampling edges has an expected number of sampling edges, and wherein generating the count comprises counting a number of data bits buffered from a data line sampled based on the sampling edges, and monitoring further comprises identifying the expected number of bits to keep. In one embodiment, identifying the expected number of bits to keep further comprises identifying a last sampled bit of the burst, counting back in the buffer the expected number from the last sampled bit, and keeping the expected number of bits counted back from the last sampled bit of the burst. In one embodiment, the normalizer circuit drives a positive data strobe line to a high voltage rail and wherein monitoring the count comprises counting a single falling edge on the data strobe line, wherein the first sampling edges after the falling edge is identified as the initial valid edge. In one embodiment, the normalizer circuit drives an inverted data strobe line to a low voltage rail and wherein monitoring the count comprises counting a single rising edge on the data strobe line, wherein the first sampling edges after the rising edge is identified as the initial valid edge.

In one embodiment, the method further includes characterizing noise patterns for the data strobe line based on what commands cause reflections on the data strobe line, and wherein generating the count comprises counting a number of bursts, and monitoring the count further comprises preventing new read commands issued at periods expected to have reflections on the data strobe line based on the characterized noise patterns. In one embodiment, characterizing the noise patterns for the data strobe line further comprises issuing a pulse on a noise free data strobe line, and detecting the number of bursts when a reflection from the pulse is present on the data strobe line. In one embodiment, detecting when the reflection from the pulse is present on the data strobe line comprises detecting only during periods when a receive enable signal is toggled for sampling. In one embodiment, characterizing the noise patterns for the data strobe line further comprises generating two consecutive read transactions spaced by a delay, and incrementally adjusting the delay to determine when a reflection caused by the first transaction fails to affect the second transaction.

In one embodiment, the method further includes determining a specific delay period between sending a command and detecting the initial valid edge; wherein the specific delay period indicates an expected delay for subsequent bursts, and wherein monitoring the count comprises monitoring a delay period for subsequent bursts to subsequently enable the data strobe line for sampling within a preamble period. In one embodiment, the period free of noise on the data strobe line comprises a period of delay on the data strobe line between groups of bursts as specified by a communication protocol used for the data strobe line.

In one aspect, an electronic device chip with logic for avoiding false data sampling includes a data strobe line interface including a buffer to receive a burst of sampling edges for sampling a data line, wherein the data strobe line is not optimally terminated, the data strobe line having a preamble that precedes an initial valid edge, where a timing of the initial valid edge can drift within a tolerance; a normalizer circuit coupled to the data strobe line interface to drive the data strobe line to a reference voltage, the normalizer circuit to be selectively engaged to prepare the data strobe line to receive the burst of sampling edges; counter logic to generate a count triggered from an initial edge detected on the data strobe line after the normalizer circuit is engaged; and logic to identify the initial valid edge of the burst of sampling edges on the data strobe line and reject false sampling caused by noise on the data strobe line, based at least in part on the generated count.

In one embodiment, each edge of the burst has a specified time interval, and wherein the counter logic is to generate a count to identify time intervals between strobe edges on the data strobe line and the logic to identify the initial valid edge is to identify the initial valid edge based on alignment of sampling edges with the specified timer interval. In one embodiment, the logic is to further determine that a sampling edge is not the initial valid edge when a time interval greater than approximately 0.6 times a data clock cycle is detected between edges. In one embodiment, each burst of sampling edges has an expected number of sampling edges, and wherein the counter logic is to count a number of data bits buffered from a data line sampled based on the sampling edges, and the logic to identify the initial valid edge is to identifying the expected number of bits, and identify the initial valid edge based on identifying the expected number of sampled bits buffered. In one embodiment, the logic is to identify the expected number of bits to keep further by identifying a last sampled bit of the burst, counting back in the buffer the expected number from the last sampled bit, and keeping the expected number of bits counted back from the last sampled bit of the burst.

In one embodiment, the normalizer circuit is to drive the data strobe line to a voltage rail having a same polarity as noise on the data strobe line, and wherein the logic to identify the initial valid edge is to identify as the initial valid edge a first sampling edge received after the normalizer circuit stops driving the data strobe line to the voltage rail. In one embodiment, the electronic device chip further includes characterization logic to characterize noise patterns for the data strobe line based on which commands cause reflections on the data strobe line, and wherein the count logic is to count a number of cycles between commands and to prevent subsequent read commands from being issued with an experimentally determined window after a previous command on the data strobe line based on the characterized noise patterns. In one embodiment, the characterization logic is to characterize the noise patterns for the data strobe line by issuing a pulse on a noise free data strobe line, and detecting the number of bursts when a reflection from the pulse is present on the data strobe line. In one embodiment, the characterization logic is to detect only during periods when a receive enable signal is toggled for sampling. In one embodiment, the characterization logic is to characterize the noise patterns for the data strobe line by generating two consecutive read transactions spaced by a delay, and incrementally adjusting the delay to determine when a reflection caused by the first transaction fails to affect the second transaction.

In one embodiment, the electronic device chip further includes characterization logic to characterize a specific delay period between sending a command and detecting the initial valid edge; wherein the specific delay period indicates an expected delay for subsequent bursts, and wherein the data strobe line interface is to trigger a receive enable signal within a preamble period for subsequent bursts based on the characterized specific delay period. In one embodiment, the period free of noise on the data strobe line comprises a period of delay on the data strobe line between groups of bursts as specified by a communication protocol used for the data strobe line.

In one aspect, a mobile system device with logic for avoiding false data sampling includes a memory device chip; a device chip including a memory controller circuit coupled to the memory device chip, the memory controller circuit including: a data strobe line interface including a buffer to receive a burst of sampling edges for sampling a data line, wherein the data strobe line is not optimally terminated, the data strobe line having a preamble that precedes an initial valid edge, where a timing of the initial valid edge can drift within a tolerance; a normalizer circuit coupled to the data strobe line interface to drive the data strobe line to a reference voltage, the normalizer circuit to be selectively engaged to prepare the data strobe line to receive the burst of sampling edges; counter logic to generate a count triggered from an initial edge detected on the data strobe line after the normalizer circuit is engaged; and logic to identify the initial valid edge of the burst of sampling edges on the data strobe line and reject false sampling caused by noise on the data strobe line, based at least in part on the generated count; and a touchscreen display coupled to generate a display based on data accessed from the memory device chip.

In one embodiment, each edge of the burst has a specified time interval, and wherein the counter logic is to generate a count to identify time intervals between strobe edges on the data strobe line and the logic to identify the initial valid edge is to identify the initial valid edge based on alignment of sampling edges with the specified timer interval. In one embodiment, the logic is to further determine that a sampling edge is not the initial valid edge when a time interval greater than approximately 0.6 times a data clock cycle is detected between edges. In one embodiment, each burst of sampling edges has an expected number of sampling edges, and wherein the counter logic is to count a number of data bits buffered from a data line sampled based on the sampling edges, and the logic to identify the initial valid edge is to identifying the expected number of bits, and identify the initial valid edge based on identifying the expected number of sampled bits buffered. In one embodiment, the logic is to identify the expected number of bits to keep further by identifying a last sampled bit of the burst, counting back in the buffer the expected number from the last sampled bit, and keeping the expected number of bits counted back from the last sampled bit of the burst. In one embodiment, the normalizer circuit is to drive the data strobe line to a voltage rail having a same polarity as noise on the data strobe line, and wherein the logic to identify the initial valid edge is to identify as the initial valid edge a first sampling edge received after the normalizer circuit stops driving the data strobe line to the voltage rail.

In one embodiment, the mobile device further includes characterization logic to characterize noise patterns for the data strobe line based on which commands cause reflections on the data strobe line, and wherein the count logic is to count a number of cycles between commands and to prevent subsequent read commands from being issued with an experimentally determined window after a previous command on the data strobe line based on the characterized noise patterns. In one embodiment, the characterization logic is to characterize the noise patterns for the data strobe line by issuing a pulse on a noise free data strobe line, and detecting the number of bursts when a reflection from the pulse is present on the data strobe line. In one embodiment, the characterization logic is to detect only during periods when a receive enable signal is toggled for sampling. In one embodiment, the characterization logic is to characterize the noise patterns for the data strobe line by generating two consecutive read transactions spaced by a delay, and incrementally adjusting the delay to determine when a reflection caused by the first transaction fails to affect the second transaction.

In one embodiment, the mobile device further includes characterization logic to characterize a specific delay period between sending a command and detecting the initial valid edge; wherein the specific delay period indicates an expected delay for subsequent bursts, and wherein the data strobe line interface is to trigger a receive enable signal within a preamble period for subsequent bursts based on the characterized specific delay period. In one embodiment, the period free of noise on the data strobe line comprises a period of delay on the data strobe line between groups of bursts as specified by a communication protocol used for the data strobe line.

In one aspect, an article of manufacture comprising a computer readable storage medium having content stored thereon, which when executed by a computing device performs operations for avoiding false data sampling, including: engaging a normalizer circuit on a data strobe line that is not optimally terminated, the data strobe line having a preamble that precedes an initial valid edge, the data strobe line to provide a burst of sampling edges for sampling a data line, where a timing of the initial valid edge can drift within a tolerance, the normalizer circuit to drive the data strobe line to a reference voltage; detecting an initial edge after engaging the normalizer circuit; generating a count triggered from the initial edge; and monitoring the count to identify the initial valid edge of the burst of sampling edges on the data strobe line and reject false sampling caused by noise on the data strobe line.

In one embodiment, a memory controller includes the content for engaging, detecting, generating, and monitoring of a data strobe line to read data related to a data access request for a memory device. In one embodiment, each edge of the burst has a specified time interval, and wherein the content for generating the count comprises content for generating a count to identify time intervals between strobe edges on the data strobe line and the content for monitoring the count further comprises content for identifying the initial valid edge based on alignment of sampling edges with the specified timer interval.

In one embodiment, the article of manufacture further includes content for determining that a sampling edge is not the initial valid edge when a time interval greater than approximately 0.6 times a data clock cycle is detected between edges. In one embodiment, each burst of sampling edges has an expected number of sampling edges, and wherein the content for generating the count comprises content for counting a number of data bits buffered from a data line sampled based on the sampling edges, and the content for monitoring further comprises content for identifying the expected number of bits to keep. In one embodiment, the content for identifying the expected number of bits to keep further comprises content for identifying a last sampled bit of the burst, content for counting back in the buffer the expected number from the last sampled bit, and content for keeping the expected number of bits counted back from the last sampled bit of the burst. In one embodiment, the normalizer circuit drives a positive data strobe line to a high voltage rail and wherein the content for monitoring the count comprises content for counting a single falling edge on the data strobe line, wherein the first sampling edges after the falling edge is identified as the initial valid edge.

In one embodiment, the article of manufacture further includes content for characterizing noise patterns for the data strobe line based on what commands cause reflections on the data strobe line, and wherein the content for generating the count comprises content for counting a number of bursts, and the content for monitoring the count further comprises content for preventing new read commands issued at periods expected to have reflections on the data strobe line based on the characterized noise patterns. In one embodiment, the content for characterizing the noise patterns for the data strobe line further comprises content for issuing a pulse on a noise free data strobe line, and content for detecting the number of bursts when a reflection from the pulse is present on the data strobe line. In one embodiment, the content for detecting when the reflection from the pulse is present on the data strobe line comprises content for detecting only during periods when a receive enable signal is toggled for sampling. In one embodiment, the content for characterizing the noise patterns for the data strobe line further comprises content for generating two consecutive read transactions spaced by a delay, and content for incrementally adjusting the delay to determine when a reflection caused by the first transaction fails to affect the second transaction.

In one embodiment, the article of manufacture further includes content for: determining a specific delay period between sending a command and detecting the initial valid edge; wherein the specific delay period indicates an expected delay for subsequent bursts, and wherein the content for monitoring the count comprises content for monitoring a delay period for subsequent bursts to subsequently enable the data strobe line for sampling within a preamble period. In one embodiment, the period free of noise on the data strobe line comprises a period of delay on the data strobe line between groups of bursts as specified by a communication protocol used for the data strobe line.

In one aspect, an apparatus for avoiding false data sampling includes means for engaging a normalizer circuit on a data strobe line that is not optimally terminated, the data strobe line having a preamble that precedes an initial valid edge, the data strobe line to provide a burst of sampling edges for sampling a data line, where a timing of the initial valid edge can drift within a tolerance, the normalizer circuit to drive the data strobe line to a reference voltage; means for detecting an initial edge after engaging the normalizer circuit; means for generating a count triggered from the initial edge; and means for monitoring the count to identify the initial valid edge of the burst of sampling edges on the data strobe line and reject false sampling caused by noise on the data strobe line.

In one embodiment, a memory controller includes the means for engaging, detecting, generating, and monitoring of a data strobe line to read data related to a data access request for a memory device. In one embodiment, each edge of the burst has a specified time interval, and wherein the means for generating the count comprises means for generating a count to identify time intervals between strobe edges on the data strobe line and the means for monitoring the count further comprises means for identifying the initial valid edge based on alignment of sampling edges with the specified timer interval. In one embodiment, the apparatus further includes means for determining that a sampling edge is not the initial valid edge when a time interval greater than approximately 0.6 times a data clock cycle is detected between edges. In one embodiment, each burst of sampling edges has an expected number of sampling edges, and wherein the means for generating the count comprises means for counting a number of data bits buffered from a data line sampled based on the sampling edges, and the means for monitoring further comprises means for identifying the expected number of bits to keep. In one embodiment, the means for identifying the expected number of bits to keep further comprises means for identifying a last sampled bit of the burst, means for counting back in the buffer the expected number from the last sampled bit, and means for keeping the expected number of bits counted back from the last sampled bit of the burst. In one embodiment, the normalizer circuit drives a positive data strobe line to a high voltage rail and wherein the means for monitoring the count comprises means for counting a single falling edge on the data strobe line, wherein the first sampling edges after the falling edge is identified as the initial valid edge.

In one embodiment, the apparatus further includes means for characterizing noise patterns for the data strobe line based on what commands cause reflections on the data strobe line, and wherein the means for generating the count comprises means for counting a number of bursts, and the means for monitoring the count further comprises means for preventing new read commands issued at periods expected to have reflections on the data strobe line based on the characterized noise patterns. In one embodiment, the means for characterizing the noise patterns for the data strobe line further comprises means for issuing a pulse on a noise free data strobe line, and means for detecting the number of bursts when a reflection from the pulse is present on the data strobe line. In one embodiment, the means for detecting when the reflection from the pulse is present on the data strobe line comprises means for detecting only during periods when a receive enable signal is toggled for sampling. In one embodiment, the means for characterizing the noise patterns for the data strobe line further comprises means for generating two consecutive read transactions spaced by a delay, and means for incrementally adjusting the delay to determine when a reflection caused by the first transaction fails to affect the second transaction.

In one embodiment, the apparatus further includes means for: determining a specific delay period between sending a command and detecting the initial valid edge; wherein the specific delay period indicates an expected delay for subsequent bursts, and wherein the means for monitoring the count comprises means for monitoring a delay period for subsequent bursts to subsequently enable the data strobe line for sampling within a preamble period. In one embodiment, the period free of noise on the data strobe line comprises a period of delay on the data strobe line between groups of bursts as specified by a communication protocol used for the data strobe line.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method comprising:
    engaging a normalizer circuit on a data strobe line, the data strobe line to provide a burst of sampling edges for sampling a data line, the normalizer circuit to drive the data strobe line toward a rail voltage prior to a preamble to precede an initial valid edge of the burst;
    detecting pulses on the data strobe line after engaging the normalizer circuit;
    measuring lengths of time between the pulses;
    determining that a period of time between two of the pulses is the preamble based on the period having a measured length that is greater than or equal to a threshold;
    determining that an initial edge after the period determined to be the preamble is the initial valid edge of the burst; and
    ignoring samples generated from sampling the data line prior to the initial valid edge.

2. The method of claim 1, wherein a memory controller performs the engaging, detecting, generating, and monitoring of a data strobe line to read data related to a data access request for a memory device.

3. The method of claim 1, wherein determining that the period of time is the preamble based on the period having a measured length that is greater than or equal to a threshold comprises determining that the period is greater than a maximum expected length of time between adjacent pulses in the burst.

4. The method of claim 1, wherein each burst of sampling edges of a transaction has an expected number of sampling edges, the method further comprising: counting a number of data bits in a buffer from a data line sampled based on the sampling edges, and identifying the expected number of bits to keep.

5. The method of claim 4, wherein identifying the expected number of bits to keep comprises identifying a last sampled bit of the burst, counting back in the buffer the expected number from the last sampled bit, and keeping the expected number of bits counted back from the last sampled bit of the burst.

6. The method of claim 1, wherein the normalizer circuit is to drive the data strobe line toward the rail voltage having a same polarity as noise on the data strobe line.

7. The method of claim 1, further comprising:
characterizing noise patterns for the data strobe line based on what commands cause reflections on the data strobe line;
counting a number of bursts; and
preventing new read commands issued at periods expected to have reflections on the data strobe line based on the characterized noise patterns.

8. The method of claim 7, wherein characterizing the noise patterns for the data strobe line further comprises issuing a pulse on a noise free data strobe line, and detecting the number of bursts when a reflection from the pulse is present on the data strobe line.

9. The method of claim 8, wherein detecting when the reflection from the pulse is present on the data strobe line comprises detecting only during periods when a receive enable signal is toggled for sampling.

10. The method of claim 7, wherein characterizing the noise patterns for the data strobe line further comprises generating two consecutive read transactions spaced by a delay, and incrementally adjusting the delay to determine when a reflection caused by a first of the read transactions fails to affect a second of the read transactions.

11. The method of claim 1, further comprising:
determining a specific delay period between sending a command and detecting the initial valid edge;
wherein the specific delay period indicates an expected delay for subsequent bursts, and wherein monitoring the count comprises monitoring a delay period for subsequent bursts to subsequently enable the data strobe line for sampling within a preamble period.

12. The method of claim 11, wherein the period free of noise on the data strobe line comprises a period of delay on the data strobe line between groups of bursts as specified by a communication protocol used for the data strobe line.

13. An electronic device chip comprising:
a data strobe line interface including a buffer to receive a burst of sampling edges for sampling a data line;
a normalizer circuit coupled to the data strobe line interface to drive the data strobe line toward a rail voltage prior to a preamble to precede an initial valid edge of the burst;
counter logic to measure lengths of time between pulses on the data strobe line after engagement of the normalizer circuit; and
logic to:
determine that a period of time between two of the pulses is the preamble based on the period having a measured length that is greater than or equal to a threshold;
determine that an initial edge after the period determined to be the preamble is the initial valid edge of the burst; and
ignore samples generated from sampling the data line prior to the initial valid edge.

14. The electronic device chip of claim 13, wherein each burst of sampling edges has an expected number of sampling edges, and wherein the counter logic is to count a number of data bits buffered from a data line sampled based on the sampling edges, identify the expected number of bits, and identify the initial valid edge based on identifying the expected number of sampled bits buffered.

15. The electronic device chip of claim 13, wherein the normalizer circuit is to drive the data strobe line to a voltage rail having a same polarity as noise on the data strobe line.

16. The electronic device chip of claim 13, further comprising characterization logic to characterize noise patterns for the data strobe line based on which commands cause reflections on the data strobe line, and wherein the count logic is to count a number of cycles between commands and to prevent subsequent read commands from being issued with an experimentally determined window after a previous command on the data strobe line based on the characterized noise patterns.

17. The electronic device chip of claim 13, further comprising characterization logic to characterize a specific delay period between sending a command and detecting the initial valid edge; wherein the specific delay period indicates an expected delay for subsequent bursts, and wherein the data strobe line interface is to trigger a receive enable signal within a preamble period for subsequent bursts based on the characterized specific delay period.

18. A mobile system device comprising:
a memory device chip;
a device chip including a memory controller circuit coupled to the memory device chip, the memory controller circuit including:
a data strobe line interface including a buffer to receive a burst of sampling edges for sampling a data line;
a normalizer circuit coupled to the data strobe line interface to drive the data strobe line toward a rail voltage prior to a preamble to precede an initial valid edge of the burst,
counter logic to measure lengths of time between pulses on the data strobe line after engagement of the normalizer circuit; and
logic to:
determine that a period of time between two of the pulses is the preamble based on the period having a measured length that is greater than or equal to a threshold;
determine that an initial edge after the period determined to be the preamble is the initial valid edge of the burst; and
ignore samples generated from sampling the data line prior to the initial valid edge.

19. The mobile system device of claim 18, wherein each burst of sampling edges has an expected number of sampling edges, and wherein the counter logic is to count a number of data bits buffered from a data line sampled based on the sampling edges, identify the expected number of bits, and identify the initial valid edge based on identifying the expected number of sampled bits buffered.

20. The mobile system device of claim 18, wherein the normalizer circuit is to drive the data strobe line to a voltage rail having a same polarity as noise on the data strobe line.

21. The mobile system device of claim 18, further comprising characterization logic to characterize noise patterns for the data strobe line based on what commands cause reflections on the data strobe line, and wherein the count logic is to count a number of bursts, wherein the data strobe line interface is to prevent sampling at periods expected to have reflections on the data strobe line based on the characterized noise patterns.

22. The mobile system device of claim 18, further comprising characterization logic to characterize a specific delay period between sending a command and detecting the initial valid edge; wherein the specific delay period indicates an expected delay for subsequent bursts, and wherein the data strobe line interface is to trigger a receive enable signal within a preamble period for subsequent bursts based on the characterized specific delay period.

23. The mobile system device of claim 18, further comprising:
    a touchscreen display coupled to generate a display based on data accessed from the memory device chip.

\* \* \* \* \*